United States Patent [19]

Furuhashi et al.

[11] Patent Number: 5,287,468
[45] Date of Patent: Feb. 15, 1994

[54] METHOD AND APPARATUS FOR PROCESSING INFORMATION DATA

[75] Inventors: Makoto Furuhashi, Kanagawa; Katsumi Yamaoka, Saitama, both of Japan

[73] Assignee: Sony Corporation, Tokyo, Japan

[21] Appl. No.: 784,144

[22] Filed: Oct. 30, 1991

Related U.S. Application Data

[63] Continuation of Ser. No. 201,414, Jun. 2, 1988, abandoned.

[30] Foreign Application Priority Data

| Jun. 3, 1987 | [JP] | Japan | 62-139122 |
| Jun. 3, 1987 | [JP] | Japan | 62-139124 |
| Aug. 13, 1987 | [JP] | Japan | 62-201031 |

[51] Int. Cl.⁵ .................... G06F 9/22; G06F 13/00
[52] U.S. Cl. .................... 395/375; 395/425; 364/DIG. 2; 364/927.92; 364/927.97; 364/946.2; 364/946.5; 364/946.6; 364/960
[58] Field of Search .................... 395/375, 425, 400

[56] References Cited

U.S. PATENT DOCUMENTS

| 4,115,852 | 9/1978 | Rozell | 364/200 |
| 4,177,515 | 12/1979 | Jenkins et al. | 364/200 |
| 4,225,922 | 9/1980 | Porter | 364/200 |
| 4,325,119 | 4/1982 | Grandmaison et al. | 364/200 |
| 4,534,013 | 8/1985 | Sheth | 364/900 |
| 4,549,263 | 10/1985 | Calder | 364/200 |
| 4,613,954 | 9/1986 | Sheth | 364/900 |
| 4,731,737 | 3/1988 | Witt et al. | 364/200 |
| 4,783,739 | 11/1988 | Calder | 364/200 |

FOREIGN PATENT DOCUMENTS 0212966 3/1987 European Pat. Off.

OTHER PUBLICATIONS

Electronics and Wireless World, Jan. 1985, David March, "Floppy Discs", pp. 43–46.
Modern Microprocessor System Design, D. R. McGlynn, John Wiley & Sons, 1980, pp. 196–197.

*Primary Examiner*—Kevin A. Kriess
*Attorney, Agent, or Firm*—William S. Frommer; Alvin Sinderbrand

[57] ABSTRACT

Method and apparatus for processing data wherein control dependency on the host computer may be lower through an external control with the aid of a simpler program and wherein the data recording/reproduction may be performed efficiently without lowering the processing efficiency of the host computer. An error correction method is employed in which the error correction capability for burst errors may be improved.

1 Claim, 12 Drawing Sheets

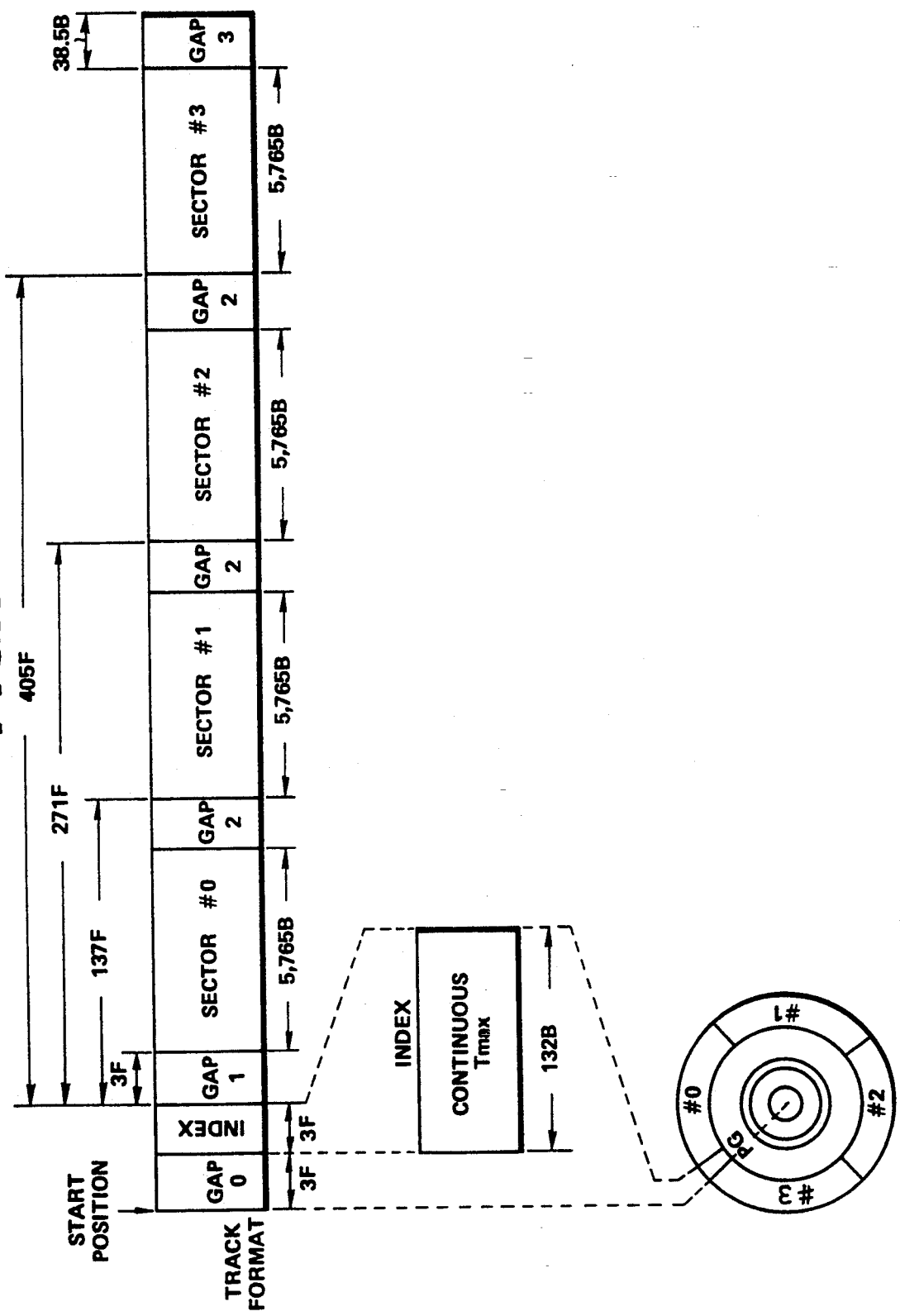

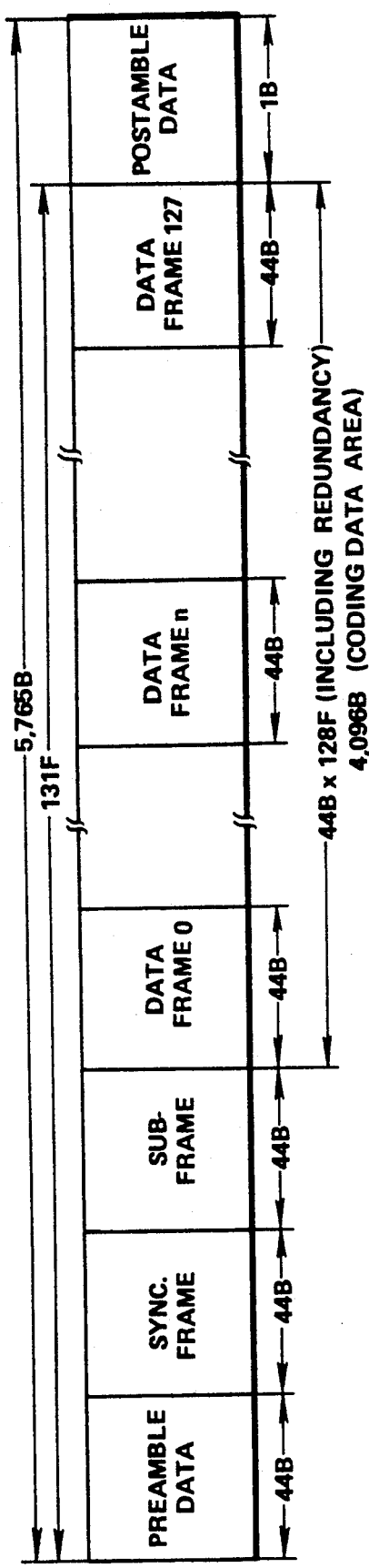
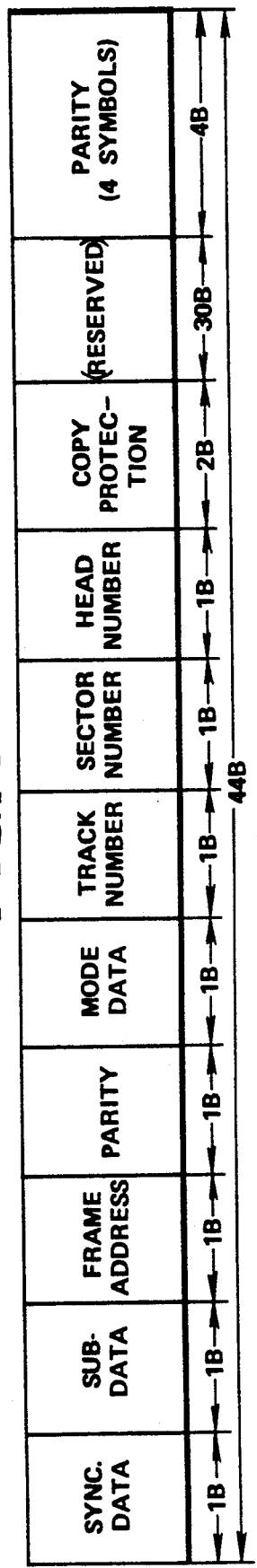
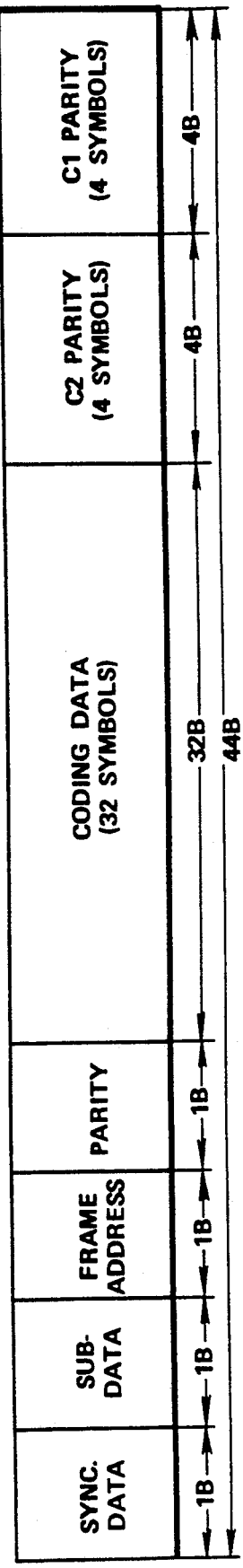

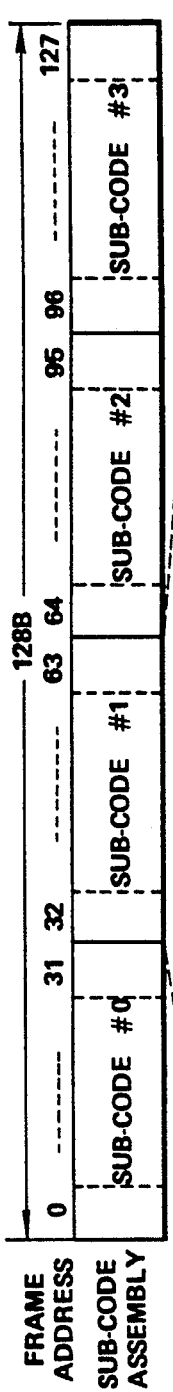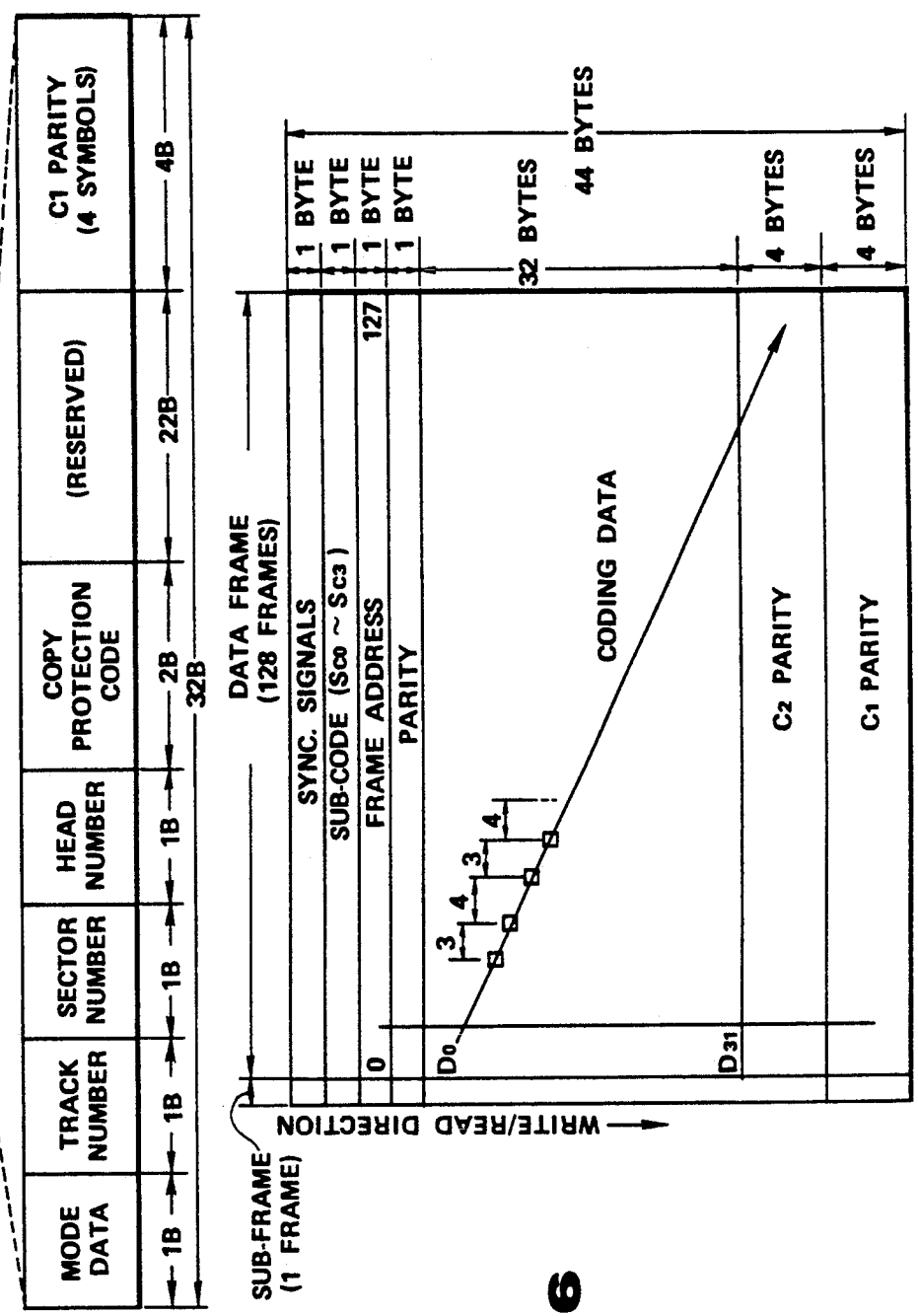
FIG. 5A
FIG. 5B
FIG. 6

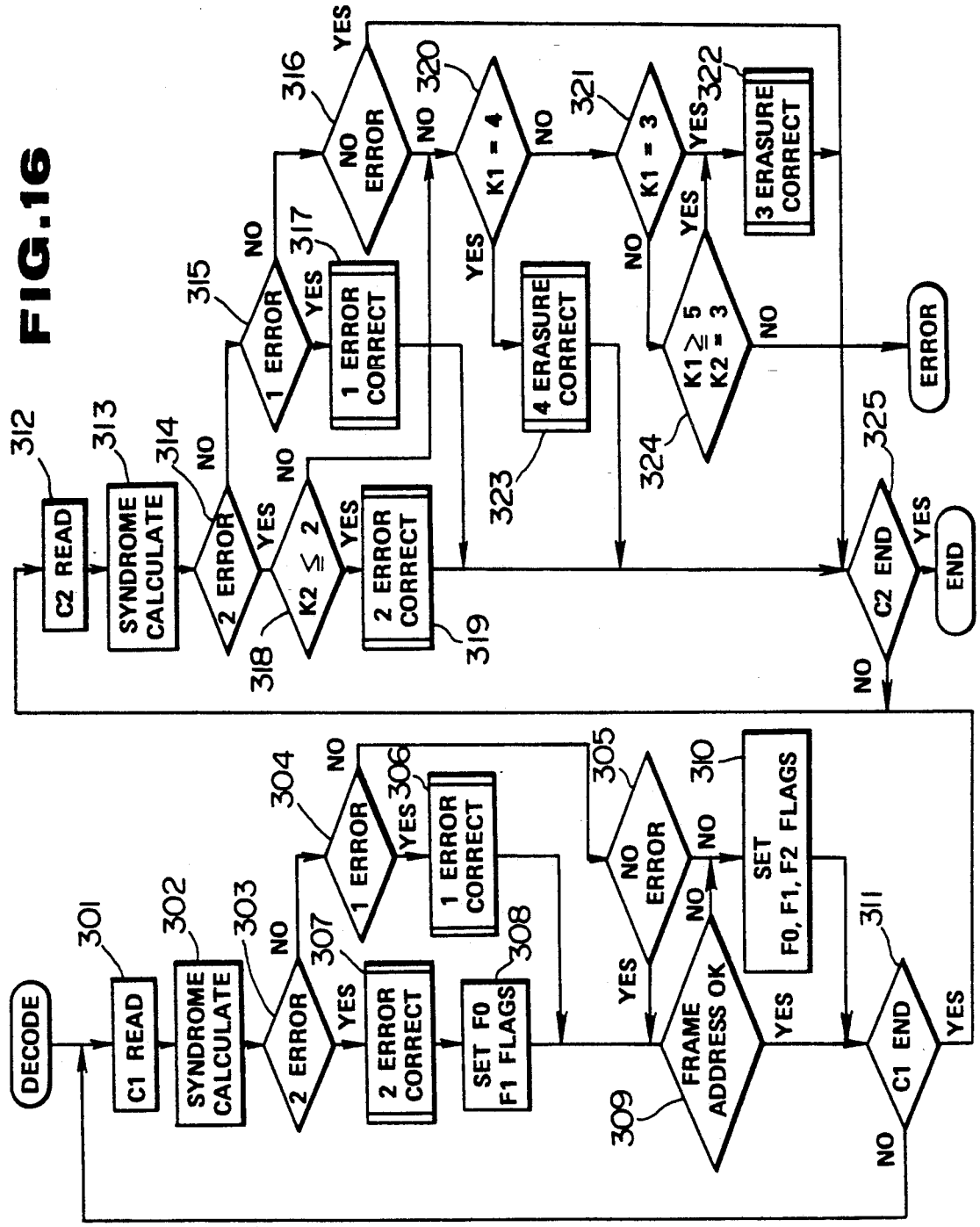

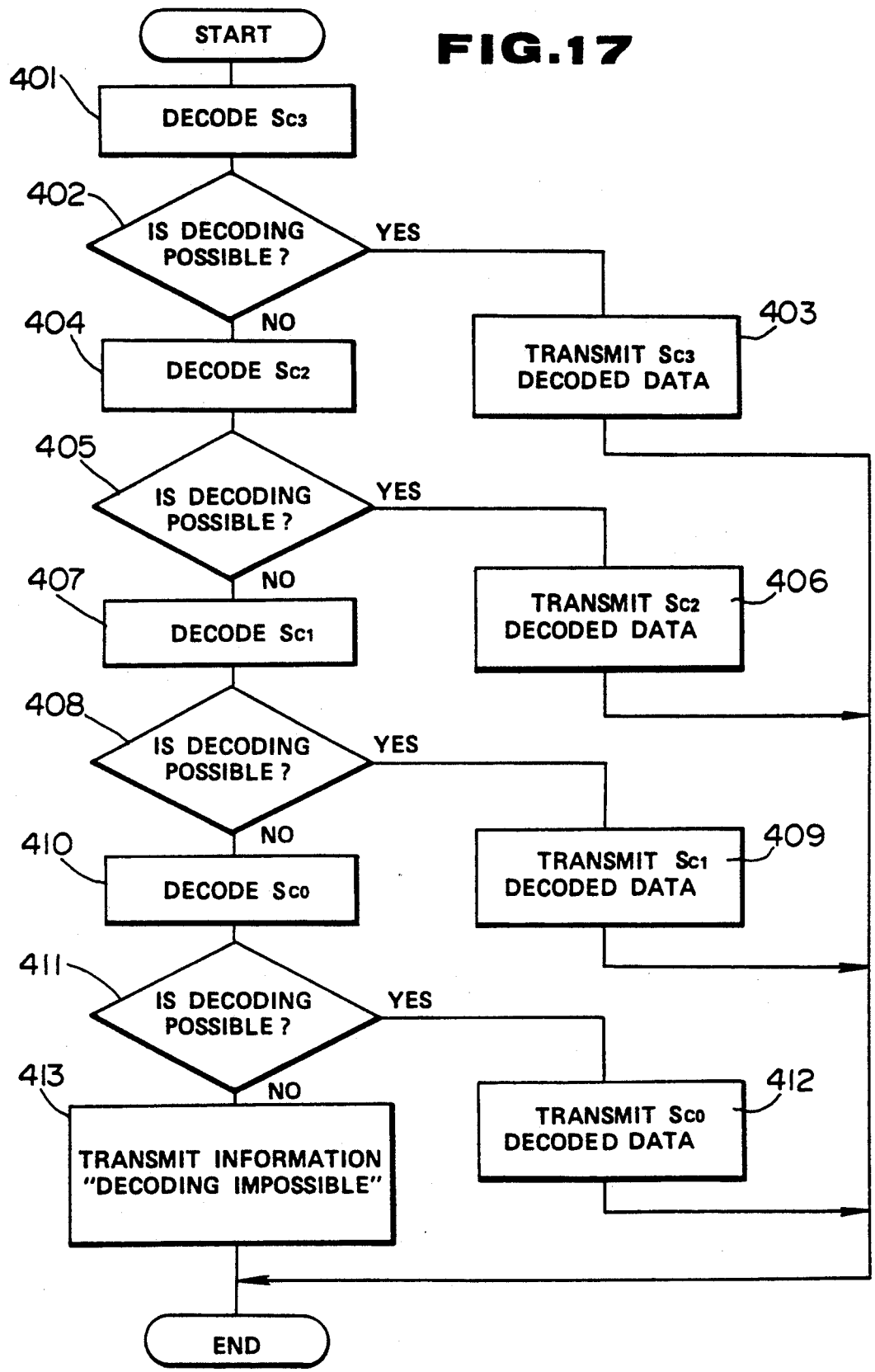

METHOD AND APPARATUS FOR PROCESSING INFORMATION DATA

This application is a continuation of application Ser. No. 07/201,414, filed Jun. 2, 1988, now abandoned.

BACKGROUND OF THE INVENTION

This invention relates to a data processing apparatus and a method used therein for correcting data errors.

In a variety of data processing apparatus, such as personal computers or word processors, a disk-shaped recording medium, such as a floppy disk, is widely used as the external storage medium.

The writing and reading of data in the floppy disk apparatus or unit is usually performed by the host computer issuing a series of control instructions to the floppy disk unit for sequentially actuating a variety of functional blocks such as rotary drive means or data processing means and the computer operation is performed sequentially in such a manner that, after the end of a predetermined control operation is ascertained, the computer proceeds to the next control operation.

In the conventional floppy disk apparatus or unit, it is therefore up to the host computer to control the operation of the disk apparatus or units from the start until the end of data recording and reproduction. Thus, a major portion of the processing capacity of the host computer is dedicated to controlling the disk unit operation so that the processing efficiency of the host computer is lowered considerably.

Furthermore, when correcting errors in the data recorded with error correction codes, flags are employed in the error correction or parity codes in the conventional triple erasure correcting routine in such a manner that, although the state of error correction is generally satisfactorily for random errors, the risk is high that a double error correction routine is executed upon the occurrence of burst errors, such that, when a 3-symbol error, for example, is taken for a 2-symbol error, the possibility is high that the correction is not feasible and the errors remain uncorrected.

OBJECTS AND SUMMARY OF THE INVENTION

It is a general object of the present invention to provide a data processing apparatus free of the above problems and an improved method employed therein for correcting data errors.

It is a specific object of the present invention to provide a novel data processing apparatus wherein control dependency on the host computer may be lowered through an external control with the aid of a simpler program and wherein the data recording/reproduction may be performed efficiently without lowering the processing efficiency of the host computer.

It is another specific object of the present invention to provide an error correction method wherein the error correction capability for burst errors may be improved.

BRIEF DESCRIPTION OF THE DRAWINGS

FIGS. 1 to 4 are diagrammatic views showing data formats employed in the disk data recording/reproducing to which the present invention is applied.

FIGS. 5A and 5B are diagrammatic views showing sub-code data formats composed of the sub-data having the formats shown in FIGS. 3 and 4.

FIG. 6 is a diagrammatic view showing the arrangement of the error correction codes having the format shown in FIG. 4.

FIG. 16 is a flow chart showing an example of the application of an error correction algorithm according to the present invention to the correction of the coding data.

FIG. 17 is a flow chart showing an example of the application of the error correction algorithm according to the present invention to the correction of the sub-codes.

DETAILED DESCRIPTION OF THE PREFERRED EMBODIMENTS

Figure 7:
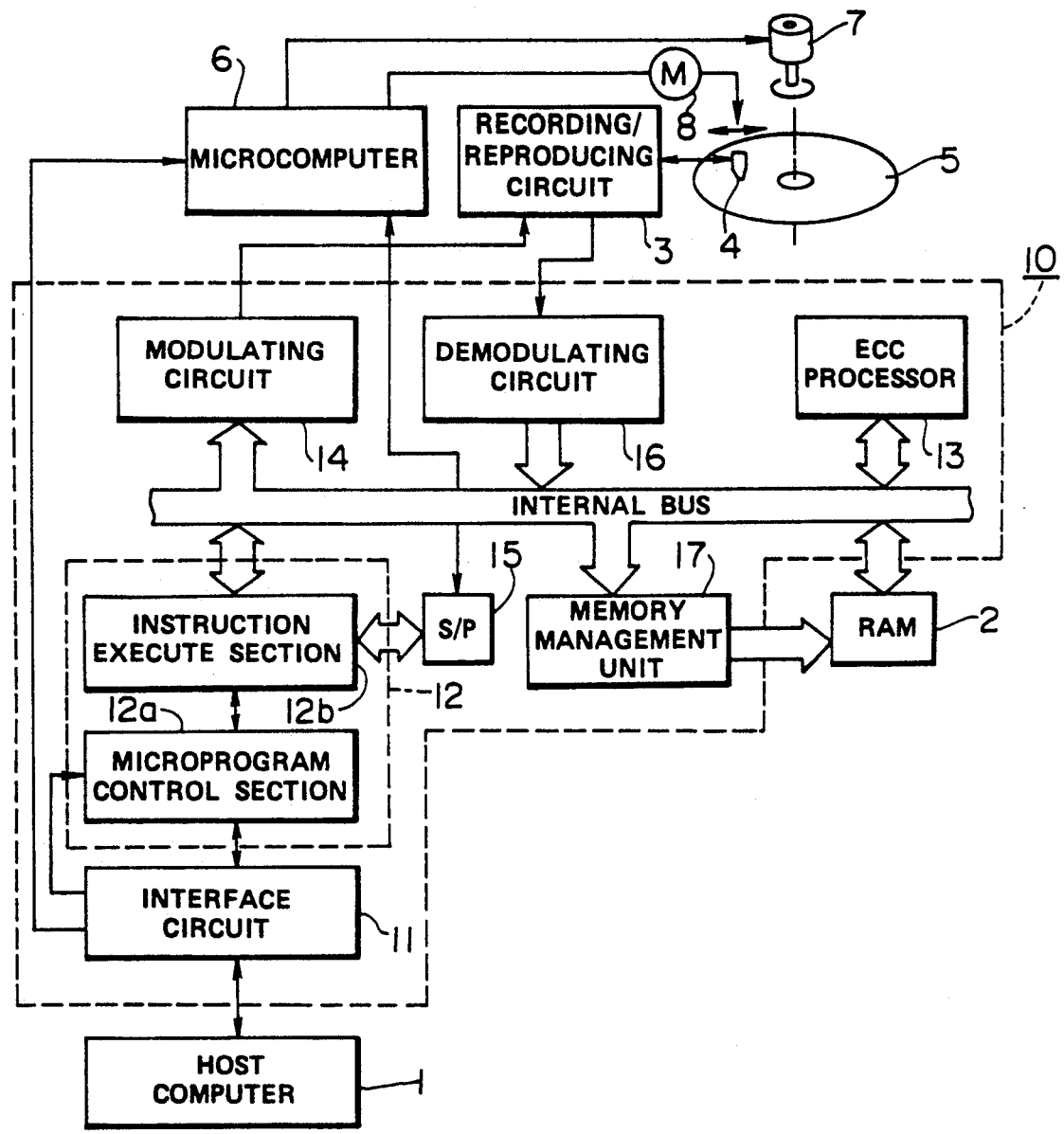
FIG. 7 is a block diagram showing a floppy disk data recording/reproducing apparatus in accordance with an embodiment of the present invention.

Before proceeding with a description of the disk data recording/reproducing apparatus to which the data processing apparatus and the error correcting method according to the present invention are applied, the data formats employed therein will be explained by referring to FIGS. 1 to 6. However, for the sake of simplicity, those formats not pertinent directly to the present invention are not explained.

First, the data format for the floppy disk will be explained.

Track Format

FIG. 1 shows a track format. Each track includes an index and four sectors #0 to #3. Thus, starting from the start position, each track is constituted by a gap 0 (pre-index gap), index, gap 1 (post-index gap), sector #0, gap 2 (sector gap), sector #1, gap 2 (sector gap), sector #2, gap 2 (sector gap), sector #3, and a gap 3 (the last gap). The index is a continuous Tmax signal. It is noted that one frame (F) is composed of 44 bytes (B), in this order, with each byte including 10 channel bits.

PG denotes a rotational phase detection signal that is produced upon rotation of a spindle motor adapted for rotationally driving the floppy disk. The signal PG is correlated with the index.

Sector Format

FIG. 2 shows a sector format. Each sector is formed by preamble data of 44 bytes, a sync frame and a sub-frame each of 44 bytes, coding data (data frames 0 to 127) and post-amble data of 1 byte, in the order nored, and has a length of 5765 bytes.

Sub-frame Format

FIG. 3 shows a sub-frame format. Each sub-frame is formed by sync data, sub-data, frame address, parity codes for the sub-data and address, mode data, track number, sector number (#0, #1, #2 or #3), head number, copy protection code, a reserved area and parity codes (4 symbols) for data following the frame address and mode data, in the order named, and has a length of 44 bytes.

Data Frame Format

FIG. 4 shows a data frame format. Each data frame is formed by sync data, sub-data, frame address, parity codes for sub-data and address, coding data (32 symbols), $C_2$ and $C_1$ parity codes (each of 4 symbols) as later described, in the order named, and has a length of 44 bytes.

Sub-Code Format

The sub-codes are formed as a sub-code assembly formed by 128 bytes each being the 1-byte sub-data of the respective data frame shown in FIG. 4 and each being collected from each of the 128 data frames for one sector, as shown in FIG. 5A. The sub-code assembly is constituted by the sub-codes #0, #1, #2 and #3. As shown in FIG. 5B, each sub-code is formed by mode data, a track number, a sector number, a head number, copy protection code, a reserve area a parity codes (4 symbols) for the above data, in the order named, and has a length of 32 bytes.

Data Frame Error Correction Code Format

The $C_2$ and $C_1$ parity codes of the data frame of FIG. 4 will be explained with reference to FIG. 6, wherein, among the data constituting one sector, the data frames taking part in the formation of the $C_2$ and $C_1$ parity codes and the sub-frame taking part in the formation of the $C_1$ parity codes and the sub-frame taking part in the formation of the $C_2$ parity code, are shown. The $C_2$ parity codes are constituted by plural symbols of the $C_2$ series or the coding data obtained on interleaving from a large number of symbols arranged in a matrix in a direction extending from the upper left towards the lower right in FIG. 6. The $C_1$ parity codes are constituted by plural symbols of the $C_1$ series extending vertically from the upper side towards the lower side in the figure, that is, the frame address, coding data and the $C_2$ parity codes. For these $C_1$ and $C_2$ parity codes, the Reed-Solomon codes, for example, are employed.

Disk Data Recording/Reproducing Apparatus

The apparatus for recording and/or reproducing the data having the above described data formats on or from the disk will now be explained with reference to FIG. 7.

The data to be recorded are supplied from a host computer 1 to a buffer memory 2 by way of an interface circuit 11 and a disk controller 12 within a disk control section 10 An S-RAM having the storage capacity of the order of 8 k bytes for each sector, for example, is employed as the buffer memory 2. The data written into the buffer memory 2 are subjected to an encoding processing shown in FIG. 6, that is, the formation and annexation of the $C_2$ and $C_1$ parity codes, by an error correction processor 13 having the encoding and decoding functions The encoded output from the buffer memory 2 is supplied to a modulating circuit 14, where it is subjected to a processing, such as 8/10 conversion, before it is supplied to a magnetic head 4 via a recording/reproducing circuit 3 so as to be recorded on a floppy disk 5. The floppy disk is driven rotationally at 3600 rpm, for example, by a spindle motor 7 controlled by a microcomputer 6 adapted to control the mechanical system. The movement of the magnetic head 4 radially in respect to the disk 5 by a motor 8 is also controlled by the microcomputer 6. A serial/parallel interface 15 is provided between the microcomputer 6 and the disk controller 12 to effect serial communication. It will be noted that the recording/reproducing circuit 3 also functions as an erasure circuit.

The data read-out by the magnetic head 4 from the floppy disk 5 is supplied via recording/reproducing circuit 3 to a demodulating circuit 16. These data are subjected to a processing including 10/8 conversion in the demodulating circuit 16 after which they are sent to and written in the buffer memory 2. The one-sector data written in the buffer memory 2 are subjected to a predetermined decoding, such as error correction by the $C_1$ and $C_2$ parity codes and removal of redundancy bits, before they are supplied via disk controller 12 and interface circuit 11 to the host computer 1.

The disk controller 12 is constituted by a microprogram control section 12a and an instruction execute or command section 12b. The microprogram control section 12a interprets or construes simple instructions supplied from the host computer 1 via interface circuit 11 to supply the micro-codes to the instruction execute section 12b for controlling a series of write/read control operations.

The control data formed in the disk controller 12 is supplied via the illustrated internal bus to a memory management unit 17.

The disk control section 10, including the interface circuit 11, the disk controller 12, the error correction processor 13, the demodulating circuit 16, the memory management unit 17 and the serial/parallel interface 15, may be constituted by, for example, a one-chip LSI (large-scale integrated) circuit.

Interface Circuit

In the embodiment of the invention being presently described, the interface circuit 11 is provided with five kinds of registers for interfacing between a control decoder 20 and the host computer 1, namely a 1-byte reset register 21, 1-byte status register 22, 1-byte command register 23, 4-byte parameter register assembly 24 including registers 24a, 24b, 24c and 24d, and a 1-byte data register 25.

These five kinds of registers are selected at the control decoder 20 by 6-bit data, that is, address bits $A_0$, $A_1$ supplied from the host computer 1, read command bit RD, write command bit WR, chip select bit CS obtained upon decoding the address at an address decoder 1a and a DMA acknowledge bit DACK, as shown in Table 1.

TABLE 1

| | | Operating State of Interface Circuit | | | | |
|---|---|---|---|---|---|---|
| DACK | CS | A$_1$ | A$_0$ | RD | WR | Operating State |
| 1 | 0 | 1 | 1 | 1 | 0 | rest system |
| 1 | 0 | 0 | 0 | 0 | 1 | read status register |
| 1 | 0 | 0 | 0 | 1 | 0 | write command register |
| 1 | 0 | 0 | 1 | 0 | 1 | read parameter register |
| 1 | 0 | 0 | 1 | 1 | 0 | write parameter |
| 1 | 0 | 1 | 0 | 0 | 1 | program reading of data |
| 1 | 0 | 1 | 0 | 1 | 0 | program writing of data |
| 0 | 1 | — | — | 0 | 1 | DMA reading of data |
| 0 | 1 | — | — | 1 | 0 | DMA writing of data |

Reset Register

Reset command data for initializing the floppy disk apparatus and calibrating the drive are supplied to the reset register 21. When the reset command is supplied to the reset register 21, the operation of the spindle motor 7 ceases immediately in the floppy disk apparatus or unit and the magnetic head 4 is returned to its home position.

Figure 9:
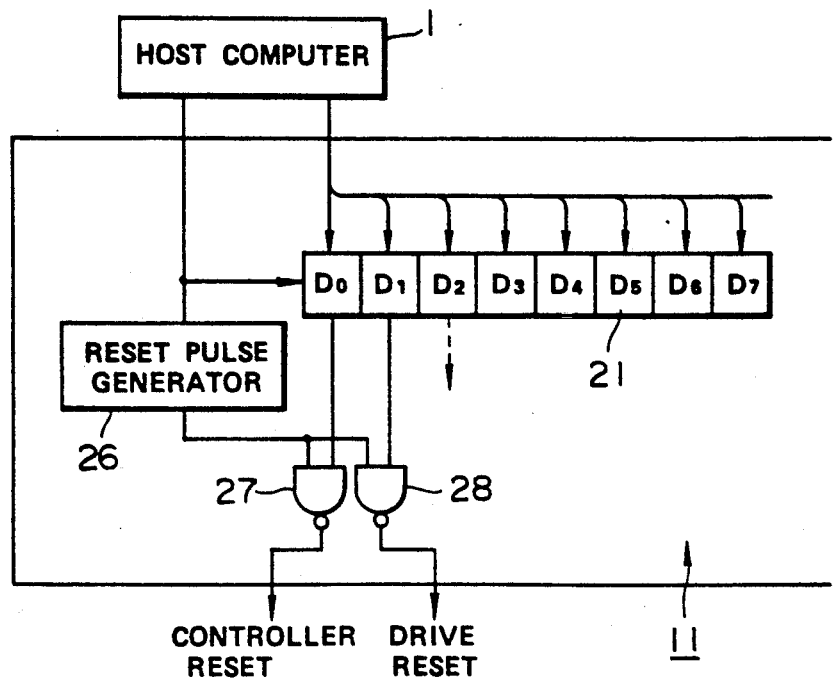
FIG. 9 is a block diagram showing a reset register and the circuit in its vicinity in the interface circuit of FIG. 8.

As shown diagrammatically in FIG. 9, the interface circuit 11 is designed and constructed in such a manner that the 8-bit reset data D7, D6, D5, D4, D3, D2, D1 and D0 supplied from the host computer 1 via data bus are written in the reset register 21 by write pulses from the host computer 1. For the foregoing purpose, the interface circuit comprises a reset pulse generator 26 adapted to form reset pulses on the basis of the write pulses, and gates 27, 28 for selectively outputting the reset pulses generated in the reset pulse generator 26 in response to the reset data D7 to D0 supplied to the reset register 21. In the present embodiment, the least significant bit D0 and the second lower bit D1 of the aforementioned 8-bit reset data D7 to D0 are respectively used as the reset flag for the microprogram control section 12a shown in FIG. 7 and as the reset flag for the microcomputer 6 for the mechanical system, also shown in FIG. 7.

During the time the microprogram control section 12a is performing a series of the above described control operations for the floppy disk control section 10, the host computer 1 monitors the contents of the status register 22 or the parameter registers 24a-24d in such a manner that, upon detection of an erroneous or mistaken operation, reset data are supplied to the reset register 21 of the interface circuit 11 for individually resetting the microprogram control section 12a or the microcomputer 6 for the mechanical system. By this resetting operation, the floppy disk control section 10 may take proper measure for correction of the mistaken operation or initialize the microcomputer 6 to the mechanical system for efficient data recording and reproduction to and from the disk 5 during the time the microprogram control section 12a alone is performing the processing operation.

Although the microprogram control section 12a and the microprogram 6 for the mechanical system are reset separately in the above embodiment, the number or the function of the devices to be reset may be correspondingly increased by a number of bits of the reset register 21.

Thus, in accordance with the present invention, recording and/or reproducing means for recording and/or reproducing data to and from the recording medium such as the disk can be externally controlled by microprogram control means by a simple program. In addition, the recording and/or reproducing means and the microprogram control means can be separately reset based on reset data supplied from the host computer to the register, so that the reset operation can be performed promptly and efficiently and the control dependency rate on the host computer is lowered for efficient data recording and reproduction without lowering the processing efficiency of the host computer.

Status Register

The status register 22 indicates the statuses of the floppy disk by 8 bits. The status information is transmitted to the host computer 1.

Figure 8:
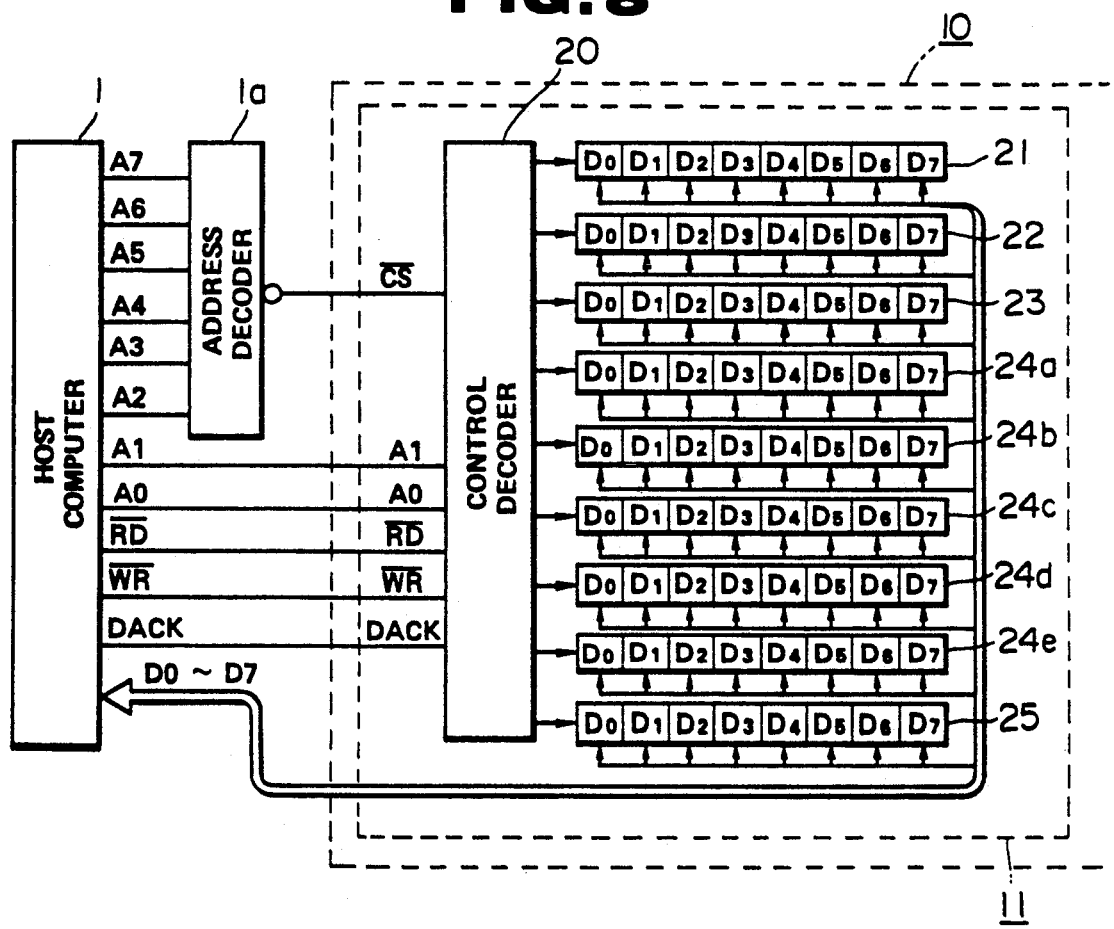
FIG. 8 is a block diagram showing the connection between the host computer and an interface circuit included in the apparatus of FIG. 7.

In the status register 22, the most significant bit D7 or (non-DMA data request) flag is used for hand-shaking in case of data transfer between the register and the external system, that is, the host computer 1, as shown in FIG. 8. This bit D7 or non-DMA data request flag becomes "1" each time data transfer is enabled, becomes "0" during data transfer and again becomes "1" on completion of the transfer of 1-byte data, such that the bit D7 is repeatedly inverted between the states "1" and "0" until a predetermined number of times of transfer is reached. The next bit D6 or (no media) flag indicates the state of attachment of the floppy disk 5. Thus, the bit D6 becomes "1" when the floppy disk 5 is not attached to the disk drive or when the floppy disk 5 is pulled out during the attachment operation by actuation of an eject button. The next bit D5 or media change flag indicates the possibility of the floppy disk 5 having been changed, thus becoming "1" when resetting is effected, when the floppy disk 5 once ejected is not as yet attached or when the disk 5 is pulled out during the disk attachment operation by actuation of the eject button. The D5 bit or the media change flag reverts to "0" when the data is read correctly from the floppy disk 5. The next bit D4, or the write protect flag indicates the write inhibit state. Thus, when no floppy disk 5 is inserted or when a floppy disk 5 is inserted for which writing is inhibited, the bit D4 or flag becomes "1" and, when the floppy disk 5 on which writing can be effected is inserted, it becomes "0". The next bit D3 or (ECC error (MSB)) flag and the bit D2 or (Ecc error (LSB)) flag indicate in two bits having four status values what error has taken place in the course of the error detection and correction carried out automatically at the ECC processor or error correcting section 13 in the course of the reading operation.

Thus, in the course of decoding (correcting) with the two series C$_1$ and C$_2$, the bits D$_3$ and D$_2$ become "00", when neither the correction routine by the C$_1$ parity nor the correction routine by the C$_2$ parity has been executed, that is, when no error has occurred. The bits D$_3$ and D$_2$ become "01", "10" and "11" when only the correction routine by the C$_1$ parity code is executed, when the correction routine by the C$_2$ parity code is also executed and when the correction is not possible, respectively.

Thus, in the case of the cross interleave Reed Solomon code (CIRC) with a distance of 5, for example, the bits D$_3$ and D$_2$ become "00" when no error has been caused, while they become "01" when the number of symbol errors is not more than two per frame, since the correction can then be made only by the C$_1$ parity code. When the number of symbol errors is not less than three per frame, the bits D$_3$ and D$_2$ become "10" since the correction routine by the C$_2$ parity is executed. When the number of symbol errors per frame is not less than three and not less than three symbol errors exist in the $C_2$ series, or the erasure correction is not possible, the bits $D_3$ and $D_2$ become "11". The values of the $D_3$ and $D_2$ flags are effective at the time when the one-sector processing is completed and represent the error status of the sector.

The next bit $D_1$ or the (drive error) flag indicates the mistaken drive operation. Thus, when the drive function is not executed correctly, the bit $D_1$ becomes "1" and is maintained in the "1" state until the read/write/erase operation is executed correctly next time or until the above reset command is received. The least significant bit $D_0$ or the (command busy) flag indicates the state of execution of the commands other than the above reset command. Thus, the bit $D_0$ becomes "1" during execution and practicing of the commands other than the above reset command and reverts to "0" with the end of processing.

In this manner, the drive state and the state of deterioration of the floppy disk 5 as the recording medium can be grasped at the host computer 1 in dependence upon the contents of the status register 22. Also, when the symbol error rate of the floppy disk 5 of the order of $10^{-3}$ is guaranteed, the kind of error can be roughly identified from the bits, i.e. the error can be assumed to be a random error when the bits $D_3$ and $D_2$ are "01" and a burst error (correctable) when the bits $D_3$ and $D_2$ are "10", respectively, since it is presumed that, when the burst error exists, the correction routine by the $C_2$ parity is performed.

Command Register

All the command data for controlling the floppy disk apparatus are afforded to the command register 23 such that the respective basic functions are enabled when the corresponding bits are set to "1". The microprogram controller 12a interprets or construes the contents of the 1-byte command data afforded to the command register 23 by the host computer 1 to cause the instruction execute section 12b to carry out the data erasure, recording or reproduction automatically and in a prescribed order.

Referring to FIG. 8, drive designate commands (unit select 1, unit select 2) are afforded to the upper bits of $D_7$ and $D_6$ of the command register 23. A maximum of four drive designations can be made by the above 2-bit drive designation commands (unit select 1, unit select 2). An execution inhibit command is afforded to the next bit $D_5$. Setting the $D_5$ bit to "0" invalidates the function specified or commanded at the lower $D_4$ t $D_0$ bits. When the processing accompanied by execution is carried out, the $D_5$ bit of register 23 is set to "1". The command (Mon: Motor On) for commanding the on-state of the spindle motor 7 is afforded to the $D_4$ bit. The spindle motor 7 is driven into rotation when the D bit is set to "1". The spindle motor 7 is halted after a predetermined time when the $D_4$ bit is set to "0". When the spindle motor 7 starts its rotation, the magnetic head 4 is moved from its home position towards the outer periphery and, when the spindle motor 7 is halted, the magnetic head reverts to the home position from its current position. It is noted that the $D_4$ bit need not be set to "1" for each ordinary read/write/erase operation, and the microprogram control section 12a is so designed and arranged that the rotation of the spindle motor 7 is automatically started with the read/write/erase operation even if the $D_4$ bit is "0" and that the motor 7 is halted with the lapse of a certain predetermined time after the end of processing. The data transfer command is supplied at the next bit $D_3$. With the $D_3$ bit set to "1", data transmission and reception may occur between the floppy disk apparatus and the host computer 1. The above data transmission and reception occurs by sequential transfer to the buffer memory 2 via data register. In this case, the number of the transferred data may be selected to be 4 k bytes, 512 bytes or 256 bytes, while each of the 4 k-byte addresses can be specified or designated. It is noted that the buffer memory 2 may be used as a transient bank memory for the host computer 1 without dependency on the operation of the floppy disk device. It may be accessed not only by the physical sector units of 4 k bytes but by the logical sector units of 512 and 256 bytes. The erasure command (ER: erase) is afforded to the next bit $D_2$. With the $D_2$ bit set to "1", erasure can be effected with the physical sector unit selected at the parameter register 24. The write command (WR: write) is afforded to the next bit $D_1$. With the bit $D_1$ of the command register 23 set to "1", writing can be effected at the physical sector unit specified at the parameter register 24. Index signals are recorded when the index is specified at the parameter register 24. Under the write command WR, the microprogram control section 12a performs a processing in accordance with a predetermined sequence for writing the data in the floppy disk 5. Thus, the parity data/subcode data/header information for error correction are generated automatically in the error correction processor 13 and outputted sequentially in accordance with a predetermined format. Under the write command WR, a series of data transfer/erase/write operations can be executed, and the microprogram control section 12a performs an automatic processing in accordance with a predetermined sequence. The read command (RD: read) is afforded to the next bit $D_0$ in the command register 23. With the $D_0$ bit set to "1", reading is performed with the physical sector unit designated at the parameter register 24. Index designation at the parameter register 24 is ineffective and results in a drive error in the status register 22. Under the read command (RD), the microprogram control section 12a performs a processing in accordance with a predetermined sequence for reading data from the floppy disk 5 and, at the same time that the signals are read from the floppy disk 5, causes the error correction processor 13 to perform mistaken data detection/correction on the data read into the buffer memory 2 in accordance with the predetermined format. The transfer of data reproduced from the floppy disk 5 to the buffer memory 2 and the transfer of data from the buffer memory 2 to the host computer 1 are feasible under the above read command (RD), and are automatically effected by the microprogram control section 12a in accordance with a predetermine sequence. When the reading is completed in a regular manner, the reproduced track/sector number is written into the parameter register 24.

Parameter Register

The parameter data for designating the writing of the index signals, erasure of the track units and the track/sector number when the reading/writing/erasure is performed by the physical sector units or on the physical sector basis are afforded to the parameter register assembly 24. In the embodiment presently being described, the parameter register assembly 24 is composed for example of 4 bytes. A register pointer, not shown, is advanced each time one byte is read or written, and reverts to the first byte when the accessing is continued further after completion of the reading of the last byte, herein the fourth byte, or after completion of the writing of the second byte. It is noted that the pointer reverts to the first byte at the time when accessing to the register other than the parameter register assembly 24 is performed to initialize the reception sequence of the parameter register assembly 24.

The first byte or register 24a of the parameter register assembly 24 is used as the physical sector address accompanied by the reading/writing/erasure operation and as a sector register for track erasure designation, index writing designation, logical sector size select designation and virtual logical sector address designation to effect the data transfer between the buffer memory 2 and the host computer 1. The sector register 24a selectively designates, by its bits $D_7$ and $D_6$, the three kinds of the logical sector size while designating the index writing and erasure of one track in its entirety when the bits $D_7$ and $D_6$ of register 24a are "1" and "1". When the write/erase combinational command is afforded to the command register 23, with the upper two bits $D_7$ and $D_6$ of the sector register 24a being set to "1" and "1", the microprogram control section 12a causes the index signals to be written after erasure of the track in its entirety. With the index signals thus written into the floppy disk 5, the floppy disk 5 may then be accessed by physical sector units. The next two bits $D_5$ and $D_4$ of the register 24a designate the 4 k-byte physical sector address and assume effective values when the reading operation is carried out as normally. These bits $D_5$ and $D_4$ can be collated as the occasion may require with the physical sector address designated at the host computer 1. The four lower side bits $D_3$, $D_2$, $D_1$ and $D_0$ designate the logical sector address of the 512 byte units.

The second byte or register 24b of the parameter register assembly 24 is used as the track register for designating the track number. When the reading is performed in a regular manner, the lower seven bits of the track register 24b become effective as the track number, and can be collated as the occasion may require with the track address designated at the host computer 1. The 2-byte copy protection code $CPC_1$ is afforded to the two registers 24c, 24d constituting the third and fourth bytes of the parameter register assembly 24.

Data Register

The data register 25 is used for data transfer between the floppy disk and the host computer 1. Both the program and the DMA are transferred through this register 25.

Memory Management Unit

Figure 10:
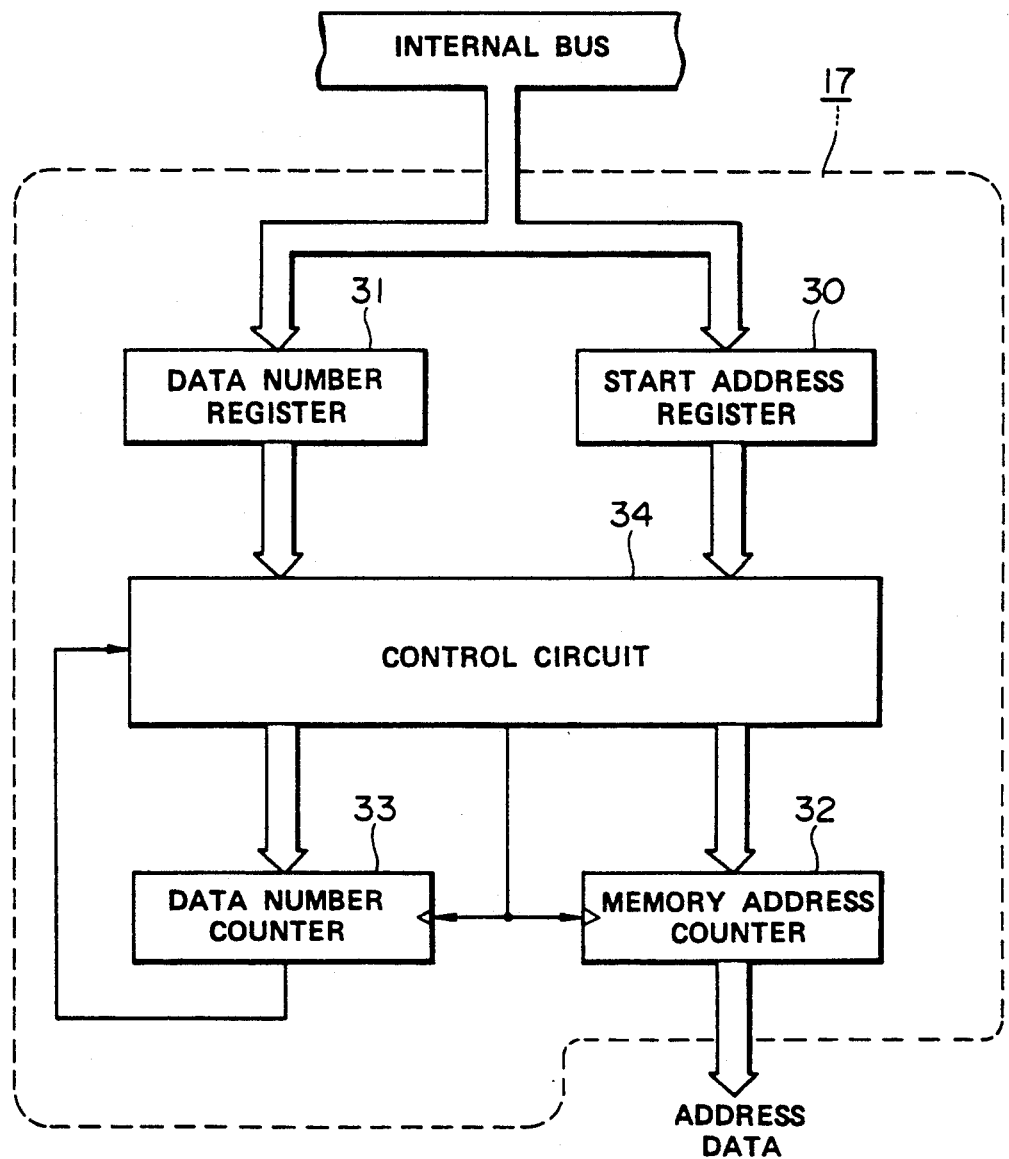
FIG. 10 is a block diagram showing details of a memory control or management unit included in the apparatus of FIG. 7.

The memory management unit 17 responsible for address management of the buffer memory 2 has the configuration shown in FIG. 10 so as to be able not only to read or write data on the sector basis in the aforementioned recording or reproducing mode, but also to be able to read or write any desired number of data other than the number of one-sector unit data of 4096 bytes or the number of unit data prescribed by the operating system (OS) of the host computer 1, from and to desired addresses of the buffer memory 2, by way of transferring data between the buffer memory 2 and the host computer 1.

The memory management unit 17 is composed of a start address register 30 for previously storing data indicating the access start address when an access is had to the buffer memory 2 from the host computer 1 to effect data transfer to write or read data, that is, the transfer start address data. A data number register 31 is included in unit 17 for previously storing the number of the transferred data, and a memory address counter 32 is provided for presetting the transfer start address data stored in the start address register 30, and a data number counter 33 is provided for presetting data concerning the number of the data stored in the data number register 31. A control circuit 34 is operative for preset and count control of the memory address counter 32 and the data number counter 33. The unit 17 performs the memory control of the buffer memory 2 in the following manner.

When accessing the buffer memory 2 from the host computer 1 to effect data transfer for writing or reading data, the memory management unit 17 is previously supplied with data indicating the transfer start address data and the number of the transferred data from the host computer 1. The unit 17 also has transfer start address data and data number data stored in the start address register 30 and the data number register 31, respectively. Before starting data transfer, the control circuit 34 causes the transfer start address data and the data indicating the transferred data to be preset in the memory address counter 32 and in the data number counter 33, respectively, and accesses 10 to the buffer memory 2 from the address indicated in the transfer start address data preset in the memory address counter 32. The data transfer is then started. Each time the transfer of one-byte data is completed, the control circuit 34 causes count pulses to be supplied to the memory address counter 32 and the data number counter 33 to increment the memory address counter 32 while simultaneously decrementing the data number counter 33. Thus, the data is transferred until the value of the data number counter 33 is reduced to zero. In other words, a number of data equal to the value preset in the data number register 31 is transferred, and then the data transfer is terminated.

Thus the buffer memory 2 may be accessed from the host computer 1 from a given address to another given address to write or read a desired number of data, so that, when transferring a number of data other than the number equal to a number raised to the powers of 2 or an integral number of times thereof, any wasteful access time to the buffer memory may be eliminated to improve the data transfer efficiency.

Buffer Memory Map

Figure 11:
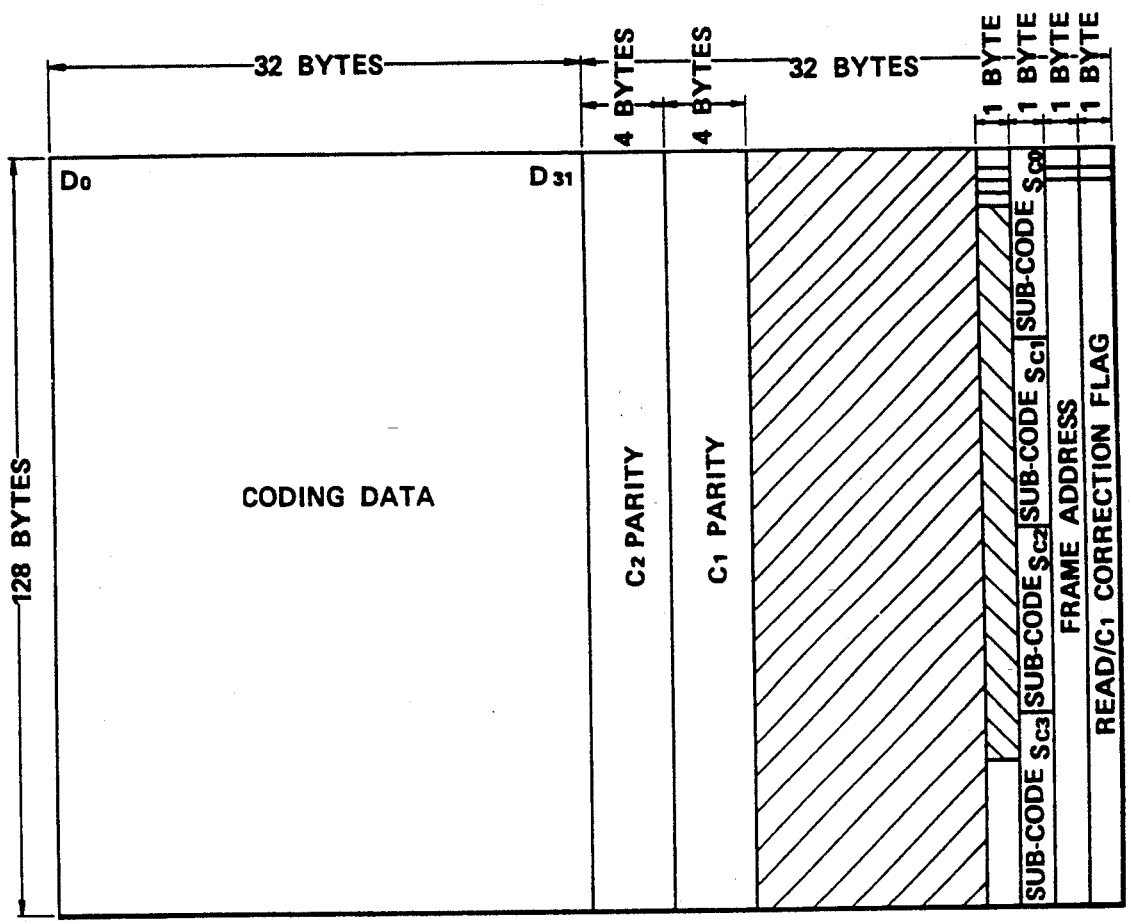
FIG. 11 is a diagrammatic view showing a memory map of a buffer memory included in the apparatus of FIG. 7.

Referring to FIG. 11, each sector of the buffer memory 2 has a capacity of about 8 k (8192) bytes, of which about 6 k (6144) bytes represent a usable area. The area shown by hatched lines is not pertinent directly to the present invention and therefore the related description is omitted for simplicity. The 128-frame or one-sector coding data is written in the left half 32×128 byte portion in FIG. 11. The $C_2$ and $C_1$ parity codes are written in the 4×128 byte areas adjacent to the area where the coding data are written. The $C_1$ correction flags dependent on the results of the error correction decoding by the $C_1$ parity codes and the read flag indicating the data write time are written in the 1×128 byte area at the right-hand side of FIG. 11. The read flags and the $C_1$ correction flags are set for each frame, with the read and $C_1$ correction flags for each frame being written in the same 8-bit byte. The frame address is written in the 1×128 byte area adjacent to the area containing the read and $C_1$ correction flags. The sub-codes $S_{C0}$ to $S_{C3}$ having the contents described above with reference to FIG. 4 are written in the 1×128 byte area adjacent to the area where the frame address is written. In FIG. 11, the upper 4-byte area of the 1×128 byte area adjacent to the sub-code containing area is reserved for the correction flags by the parity codes of the sub-codes, while the lower 7-byte area is used as the internal register for the ECC processor 13.

Figure 12:
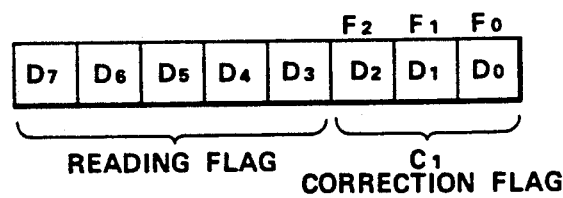
FIGS. 12A and 12B are diagrammatic views to which reference will be made in explaining the read correction flag area on the memory map shown in FIG. 11.
Figure 12:
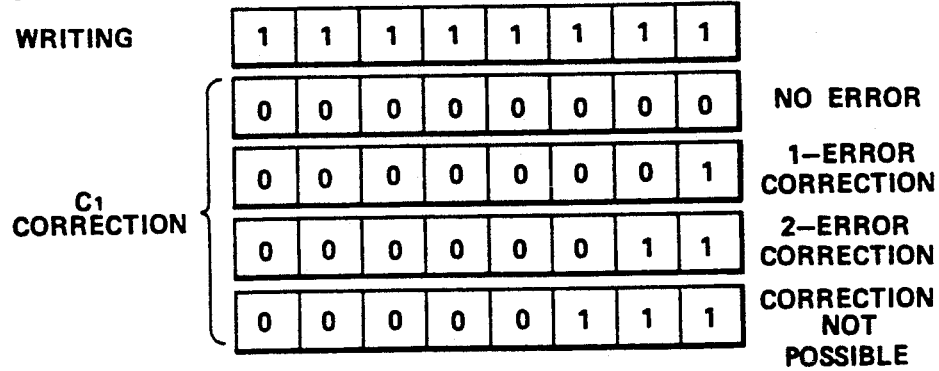

The read flags and the $C_1$ correction flags will be described in detail. As shown on an enlarged scale in FIG. 12A, the reading flags and the $C_1$ correction flags for each frame are written in the 1-byte or 8-bit area in the buffer memory 2. The upper five bits $D_3$ to $D_7$ and the three bits $D_0$ to $D_2$ represent the area for the read flags and the area for the $C_1$ correction flags, respectively. As shown in FIG. 12B, when the data are written into the buffer memory 2, all the bits are "1". When the error correction and decoding is performed by the $C_1$ parity codes, the upper 5-bits for reading flags are all "0", while the lower 3 bits for $C_1$ correction flags are "1" or "0" depending upon the results of correction and decoding. Thus, the bits $D_2$, $D_1$, and $D_0$ are "000" when there is no error, "001" when one error is to be corrected, "011" when 2 errors are to be corrected and "111" when the correction is impossible. In other words, a flag is set at the bit $F_0$ in case of one error correction, flags are set at the bits $F_0$ and $F_1$ in case of two error corrections and flags are set at the three bits $F_0$, $F_1$, and $F_2$ in case the correction is not possible. It is noted that the above $C_1$ correction flag or flags are intended for error Correction by the $C_2$ parity codes as later described.

In this manner, the memory area for the reading flags and that for the $C_1$ correction flags are provided in one and the same byte so that only one byte suffices for the flag area for each frame. Since the upper five bits $D_7$-$D_3$ for the reading flags are all "0", that is, reset automatically, at the time of error correction by the $C_1$ parity codes, it becomes unnecessary to reset the reading flag again for reproducing the next sector.

These flag states are transferred as the occasion may require to the aforementioned status register 22 in the interface circuit 11.

Operation of the Disk Data Recording/Reproducing Apparatus

Figure 13A:
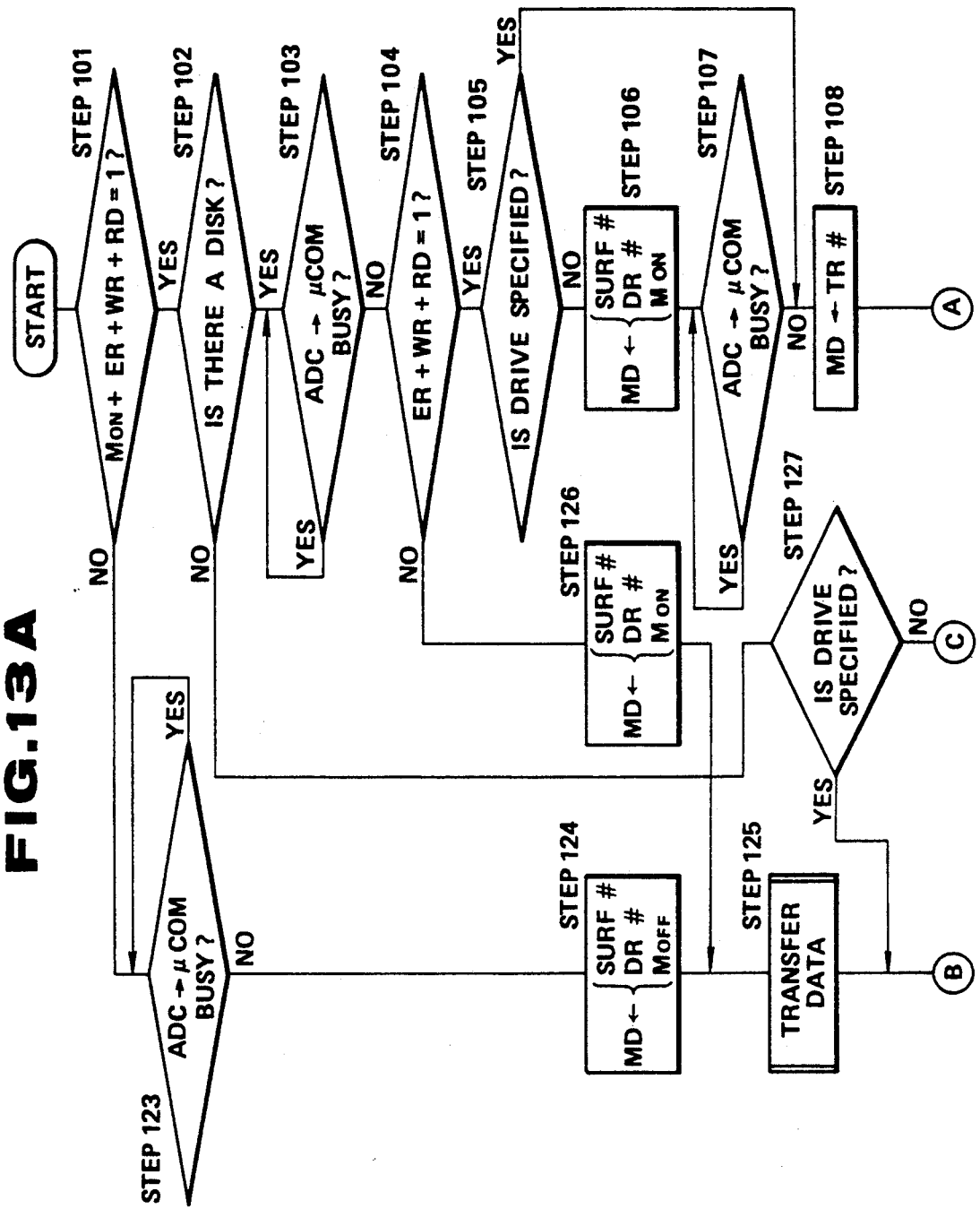
FIG. 13A and 13B are flow charts showing the operation of the disk data recording/reproducing apparatus according to the embodiment of this invention.
Figure 13B:
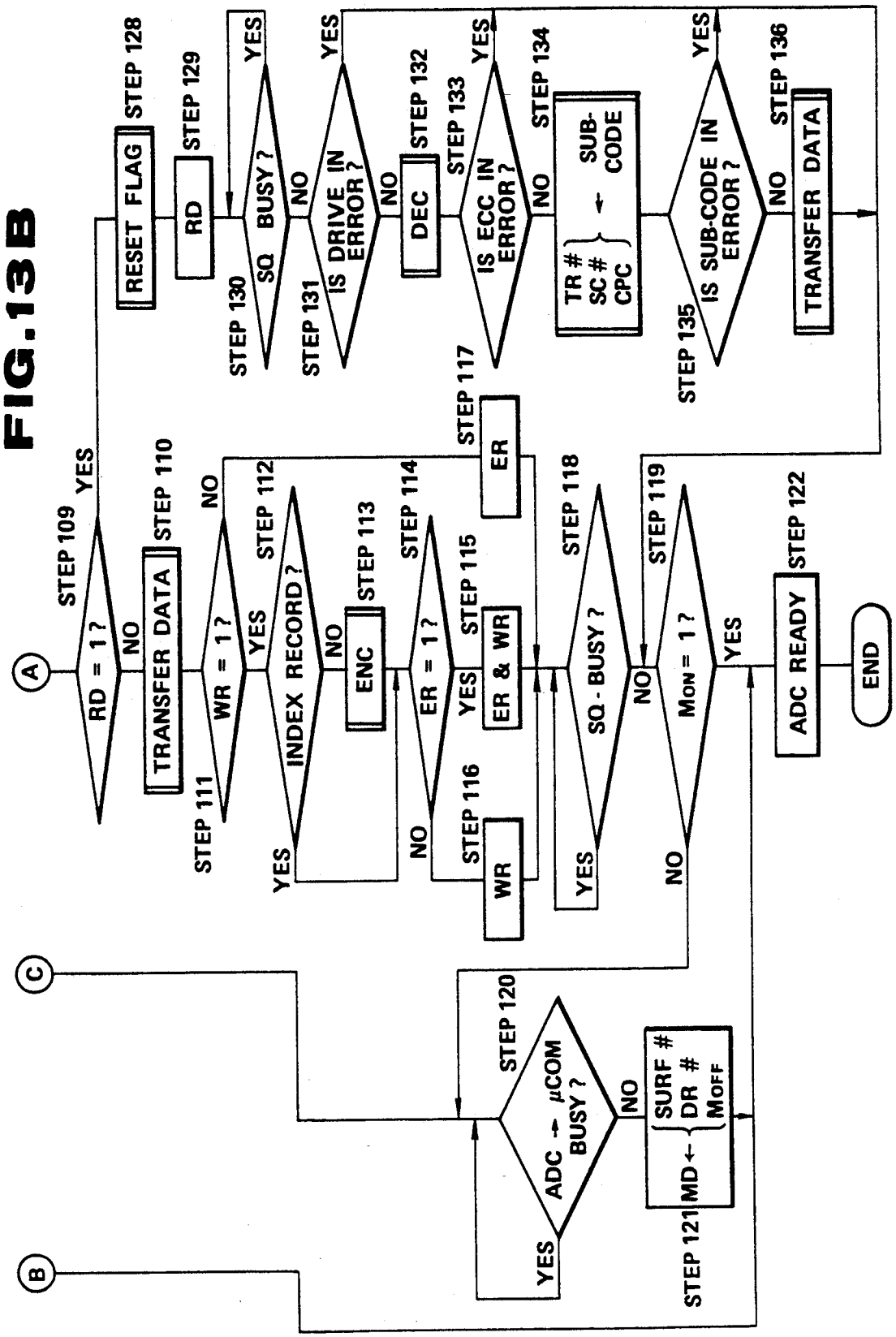

The operation of the above described disk data recording/reproducing apparatus will now be explained (with reference) to the flow chart of FIGS. 13A and 13B.

It is first determined at step 101 whether "1" has been set at the $D_4$ (Mon) bit, $D_2$ (ER) bit, $D_1$ (WR) bit or $D_0$ (RD) bit of the command register 23 by command data supplied from the host computer 1 to the command register 23. If the result is affirmative, it is determined at step 102 from the contents of the status register 22 whether the floppy disk 5 has been attached or operatively positioned in the disk drive. If the result at step 102 is affirmative, that is, when the floppy disk 5 is operatively positioned, it is determined at step 103 whether the control microcomputer ($\mu$ COM) 6 for the mechanical system is performing the processing operation. When the control microcomputer ($\mu$ COM) 6 is released from the processing operation, it is checked at step 104 whether "1" has been set at any of the $D_2$(ER); $D_1$(WR) or $D_0$(RD) bits of the command register 23. If the result at step 104 is affirmative, that is, when any of the erasure (ER), writing (WR) and reading (RD) operations has been issued from the host computer 1, it is checked at step 105 whether the drive command has been already issued by bits $D_7$, $D_6$ of the command register 23. If a new drive command is not issued, the disk surface number (SURF #), drive number (DR #) and the motor-on signal (Mon) are supplied at step 106 to the mechanical system control microcomputer or (MD) 6. It is then checked at step 107 whether control micro-computer ($\mu$ COM) 6 for the mechanical system is performing a processing operation. After the control microcomputer ($\mu$ COM)6 is released from the processing operation, the track number (TR #) set in the parameter register 24$b$ is afforded at step 108 to the mechanical system microcomputer 6. If the result at step 105 is affirmative, that is, when the drive is commanded, the program proceeds immediately to step 108 to afford the track number (TR #) of the parameter register 24 b to the mechanical system microcomputer (MD) 6. It is then determined at the next step 109 whether "1" has been set at the $D_0$ (RD) bit of the command register 23. If the result at step 109 is negative, that is, then the reading command is not issued, the data afforded to the data register 25 is transferred at step 110 to the buffer memory 2. It is then checked at step 111 whether "1" is set at the D (WR) bit of the command register 23. If the result at step 111 is affirmative, that is, when the write command is issued by the host computer 1, it is checked at the next step 112 whether the index write command is made on the basis of the bits $D_7$ and $D_6$ of the sector register 24$a$. If the index write command is not made, the program proceeds to step 113 to perform the parity encoding operation (ENC) on the data written in the buffer memory 2. It is then checked at step 114 whether "1" is set at the $D_2$ (ER) bit of the command register 23. If the result at step 112 is affirmative, that is, when the index write command has been issued, the program proceeds immediately to step 114 to check if the erasure operation has been commanded at the host computer 1. If the result at step 114 is affirmative, that is, when the erasure operation is commanded, the erasure operation (ER) and the write operation (WR) are performed at step 115. When the erasure operation (ER) is not commanded, only the write operation is performed at step 116. When the result at step 111 is negative, that is, when the recording operation is not commanded, only the erasure operation (ER) is effected at step 117. After the operations of steps 115, 116 or 117 are performed, the status of a sequence is checked in steps 118 with reference to, the flags $D_0$ (Command Busy) at the status register 22 to check that the sequence of steps 115, 116 or 117 is terminated. The program then proceeds to step 119 to check if "1" has been set at the bit $D_4$ (Mon) of the command register 23. If the result at step 119 is negative, it is then checked at step 120 whether the control microcomputer ($\mu$ COM) 6 is performing the processing operation. When the control microcomputer ($\mu$ COM) 6 is released from the processing operation, the disk surface number (SURF #), drive number (DR #) and the motor-off signal (M off) are afforded to the mechanical system microcomputer (MD) 6 at step 121. The program then proceeds to the stand-by state at step 122.

It is noted that, when the result at step 101 is negative, that is, when the host computer 1 has not commanded the operation of the floppy disk apparatus, the program proceeds to step 123 to determine if the control microcomputer ($\mu$ COM) 6) for the mechanical system is performing the processing operation. When the control microcomputer (μ COM) 6 is released from the processing operation, the disk surface number (SURF #), drive number (DR #) and the motor off signal (M off) are supplied to the control microcomputer 6 of the mechanical system at step 124 and data is transferred at step 125. The program then proceeds to a standby state at step 122. If the result at step 104 is negative, that is, when only the command (Mon) for turning on spindle motor 7 is issued at the host computer 1, but the erasure (ER), writing (WR) or reading (RD) are not commanded, the program proceeds to step 126 to afford the disk surface number (SURF #), drive number (DR #) and the motor-on (Mon) signals to the microcomputer 6 for the mechanical system effect data transfer at step 125. When the result at step 102 is negative, that is, when the floppy disk 5 is not attached in operative position in the disk drive, the program proceeds to step 127 to check if a drive is specified. If the same drive is specified, the program proceeds immediately to step 122. If a new drive is specified, the program proceeds to step 120.

If the result at step 109 is affirmative, that is, when the read operation (RD) is commanded by the host computer 1, the program proceeds to step 128 to reset the various flags. The data are then read from the floppy disk 5 to the buffer memory 2 at step 129. After reading out the data at step 129, the $D_0$ (command busy) flag of the status register 22 is checked at the next step 130 to check the status of the sequencer for ascertaining that the operation at the above step 127 is terminated. The program then proceeds to the next step 131 to check the $D_1$ bit of the status register 22 to check if the magnetic head 4 has been correctly moved to the target track and the data read-out operation has been correctly made at step 129. If there is no drive error, an error correction processing (DEC) is performed at step 132 at the error correction processor 13 by a method to be later described. At the next step 133, it is checked if there is any error that cannot be corrected by the error correcting processing at step 132. If there is no error, the track number (TR #), sector number (SC #) and the copy inhibit code (CPC) included in the sub-code data (SUB-CODE) of the read-out data are transferred to the respective registers of the parameter register assembly 24 at step 134 to check for the presence or absence of the error of the sub-code data (SUB-CODE) at step 135 by the method later described. If there is no error in the sub-code data (SUB-CODE), the data read-out at the buffer memory 2 are transferred to the host computer 1 through the aforementioned data register 25 at step 136. The program then proceeds to step 119.

If the result at any one of the steps 131, 133 and 135 is affirmative, that is, when there is an error, the program proceeds immediately to step 119.

In the floppy disk apparatus or drive according to the present embodiment, microprogram control section 12a interprets or construes the command data $D_7$, $D_6$, $D_5$, $D_4$, $D_3$, $D_2$, $D_1$, and $D_0$ supplied from the host computer 1 to the command register 23 of the interface circuit 11 to perform the following control operations.

Example of Control Operation 1

Command data $(D_7, D_6, D_5, D_4, D_3, D_2, D_1, D_0) = (0\ 0\ 1\ 0\ 0\ 1\ 1\ 0)$
(1) spindle motor on
(2) magnetic head feed (seek)
(3) erasure operation
(4) writing operation
(5) spindle motor off
(6) magnetic head feed (calibrate)

Example of Control Operation 2

Command data $(D_7, D_6, D_5, D_4, D_3, D_2, D_1, D_0) = (0\ 0\ 1\ 1\ 1\ 1\ 1\ 0)$
(1) spindle motor on
(2) magnetic head feed (seek)
(3) data transfer
(4) erasure operation
(5) writing operation

Example of Control Operation 3

Command data $(D_7, D_6, D_5, D_4, D_3, D_2, D_1, D_0) = (0\ 0\ 1\ 1\ 0\ 1\ 1\ 0)$
(1) spindle motor on
(2) magnetic head feed (seek)
(3) erasure operation
(4) writing operation

Example of Control Operation 4

$(D_7, D_6, D_5, D_4, D_3, D_2, D_1, D_0) = (0\ 0\ 1\ 0\ 0\ 0\ 0\ 1)$
(1) spindle motor on
(2) magnetic head feed (seek)
(3) reading operation
(4) spindle motor off
(5) magnetic head feed (calibrate)

Example of Control Operation 5

Command data $(D_7, D_6, D_5, D_4, D_3, D_2, D_1, D_0) = (0\ 0\ 1\ 1\ 1\ 0\ 0\ 1)$
(1) spindle motor on
(2) magnetic head feed (seek)
(3) reading operation
(4) data transfer The series of control operations characteristic of "Control Operation 1" above, that is, in which command data (0 0 1 0 0 1 1 0), is afforded as the command data $(D_7, D_6, 5, D_4, D_3, D_2, D_1, D_0)$ by the host computer 1 to the command register 23 of the interface circuit 11, will now be explained in detail.

The microprogram control section 12a interprets or construes the above command data (0 0 1 0 0 1 1 0) to afford the command signal for on-state of the spindle motor 7 (M on) and the track number (TR #) from the instruction execute section 12b by serial transfer to the microcomputer 6 of the mechanical system upon reception of the command signal (M on) and the track number (TR #). Thus, the microcomputer 6 of the mechanical system causes the spindle motor 7 to be started to cause the revolution of the floppy disk 5, while shifting or feeding the magnetic head 4 by the feed motor 8 to the position of the specified track number (TR #). During this time, the host computer 1 is advised by the microprogram control section 12a that the readying state for expelling the transferred data is completed. The host computer 1 then causes the data to be transferred to the buffer memory 2 by way of the data register 25 of the interface circuit 11. The instruction execute section 12b is also advised by the microcomputer 6 for the mechanical system that the revolutions of the spindle motor 7 are stable and the shifting of the magnetic head 4 is completed, with the recording/reproducing apparatus being in the readied state for recording. The error correcting processor 13 generates the error correcting parity codes on the data transferred from the host computer 1 to the buffer memory 11. As the instruction execute section 12b is advised by the microprogram control section 12a of the completion of the readying state for recording, and the parity codes are completely generated by the error correction processor 13, the microprogram control section 12a, actuates the recording circuit and the erasure circuit after the floppy disk 5 has been revolved to the start position of the target sector, so that the data are erased by the preceding erase head while data are recorded by a recording-/reproducing head. The microprogram control section 12a affords the motor off signal (M off) for the spindle motor 7 to the microcomputer 6 for the mechanical system by serial transfer to stop the revolutions of the spindle motor 7. The control section 12a also advises the host computer 1 that the data recording operation is now terminated.

In the above described embodiment of the data processing apparatus, stored microprogram control means interprets or construes the simple instructions supplied from the host computer to effect a series of write/read operations so that external control can be achieved by a simple program and the data recording/reproducing operation can be performed efficiently without lowering the processing efficiency of the host computer.

Figure 14:
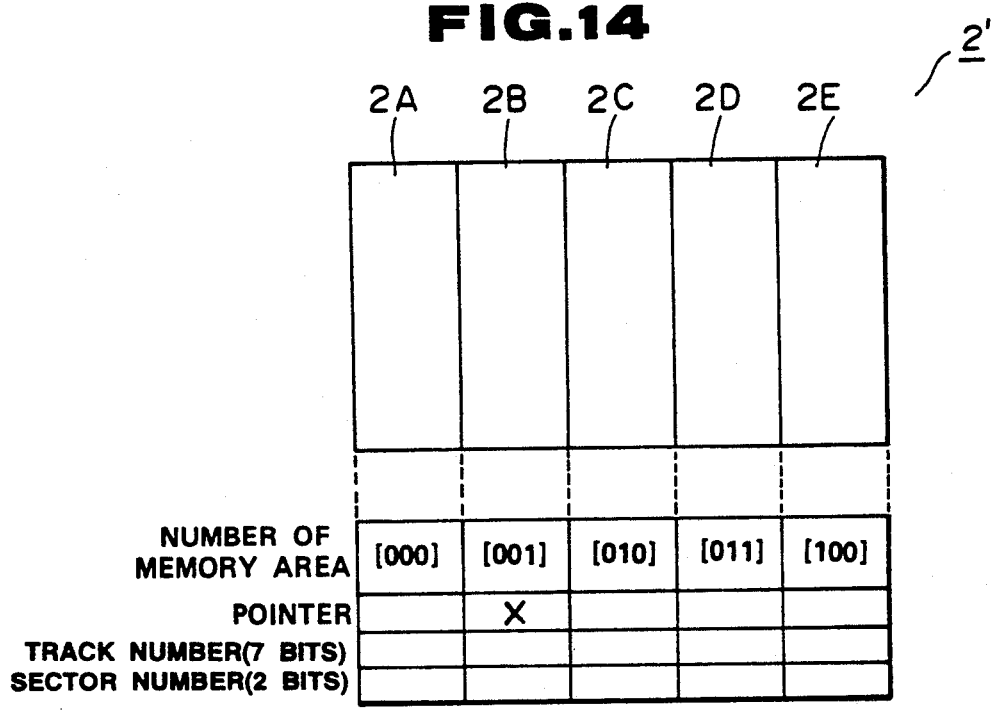
FIG. 14 is a diagrammatic view showing a buffer memory having on increased capacity.

In the above example, data reading and writing are performed by sector units, that is, on a sector basis. However, when the capacity of the buffer memory 2 is increased, plural sectors can be read consecutively on a track basis or across plural tracks. In such case, a buffer memory 2' has five memory areas 2A to 2E, for example, as shown in FIG. 14. The memory capacity of each of the memory areas 2A to 2E is selected to be sufficient to write therein the data reproduced from each sector of the floppy disk and to perform an error correction processing on the data. Thus, for the example given, the memory capacity of each memory area is selected to be not less than 6 k byte, and the buffer memory 2' has the total capacity of at least 30 k bytes. However, the memory employed herein has the total capacity of 32 k bytes.

On the other hand, parameter data for commanding the writing of the index signals and the erasure of the track units, data identifying the memory area numbers of the buffer memory 2', data for discriminating the sector and track modes from each other and the track/-sector number when the reading/writing/erasure is performed by physical sector units or track units, are supplied to a parameter register assembly each track consisting of four sectors, as mentioned above. In such case, a modified parameter assembly 24 is formed by five bytes in registers 24a–24e and distinguished in some other respects from the parameter register assembly of the preceding example. Thus the register 24c at the third byte of the modified parameter register assembly 24 is composed of a $D_7$ bit as the data "0" and "1" for discrimination of the sector and track modes from each other, three bits $D_6$, $D_5$ and $D_4$ indicating the number "0 0 0", "0 1",—"1 0 0" of each of the memory areas 2A to 2E of the buffer memory 2', and lower four spare bits $D_3$, $D_2$, $D_1$ and $D_0$.

The 2-byte copy protection codes or CPC are afforded to the registers 24d and 24e at the fourth and fifth bytes of the modified parameter register assembly 24.

Similarly to the preceding example, the 3-bit data indicating the memory area numbers, that is, "0 0", "0 0 1", "0 1 0", "0 1 1" and "1 0 0 " corresponding to the memory areas 2A to 2E, respectively, and the 1-bit data for discriminating the sector mode and a track mode from each other, are introduced into the modified parameter register assembly 24 of the interface circuit 11, along with the 7-bit track number data and the 2-bit sector number data. The buffer memory 2' is controlled on the basis of these data by the microprogram control section 12a.

The track mode, indicated by the "1" state of the associated 1-bit data, that is, the bit $D_7$ of the register 24c, will now be explained. The magnetic head 4 is moved to the track from which the data is to be reproduced. After the index signals of the track are reproduced by the magnetic head 4, and after the floppy disk 5 has made one more complete revolution, the four-sector data are reproduced from the track. These reproduced data are data demodulated and written in the memory areas 2B to 2E of the buffer memory 2'. These 4-sector data are corrected for errors by the error correcting processor 13 sector by sector and are transferred through the interface circuit 11 to the host computer 1. Similar operations are performed for the other tracks of the floppy disk 5 such that the contents of the memory areas 2B to 2E are rewritten by the 4-sector data of the tracks and corrected for errors before the data are transmitted to the host computer. In the track mode, the 4-sector data of the track are written at all times in the memory areas 2B to 2E. The host computer 1 controls the track numbers of the data stored in the memory areas 2B to 2E.

It will be appreciated from the above that, when the data, such as the programs, are recorded by track units or on the track basis on the floppy disk 5, these data are reproduced by the track units and written into the buffer memory 2', the data being then corrected for errors and transferred via interface circuit 11 to the host computer 1 for shortening the data processing time.

The usual type of the sector mode, indicated by the "0" state of the associated 1-bit data, will be explained. The magnetic head 4 is moved to the track from which the data is to be reproduced. After the index signals of the desired track are reproduced by the magnetic head 4, and after the floppy disk has made one more complete revolution, the desired 1-sector data are reproduced from the track. These reproduced data are data demodulated and written in the memory area 2A of the buffer memory 2'. The 1-sector data are corrected for errors by the error correcting processor 13 sector by sector and are transferred through the interface circuit 11 to the host computer Similar operations are performed for the other sectors of the floppy disk 5 such that the contents of the memory 2' are rewritten by sector and corrected similary for errors before the data are transmitted to the host computer 1. In the present usual type of the sector mode, the data of the sector are written at all times in the memory area 2A. The host computer 1 controls the track and sector numbers of the data stored in the memory area 2A. The special type of the sector mode, indicated by the "0" state of the associated 1-bit data, will now be explained. The magnetic head 4 is moved to a track from which the data are to be reproduced. After the index signals of the desired track are reproduced and after the floppy disk 5 has made one more complete revolution, the data for the desired 1-sector of the track are reproduced. These reproduced data are data modulated and written in, for example, the memory area 2A of the buffer memory 2'. The 1-sector data are corrected for errors by the error correcting processor 13 and transferred through the interface circuit 11 to the host computer 1. The reproduced data from the other sectors are written in the next memory area 2B of the buffer memory 2'. Similarly, the reproduced data from the separate sectors are sequentially cyclically written in the memory areas 2C, 2D, 2E, 2A . . . and corrected separately for errors. In the host computer 1, a pointer shown at X in FIG. 14 is provided and, when the data are written for example in the memory area 2C, the pointer associated with the number of the memory area 2C is moved so that it will be associated with the number of the next memory area 2D. This pointer is moved sequentially cyclically to the numbers associated with the memory areas 2A, 2B, . . . , 2E, 2A, . . . . The numbers of the memory areas 2A to 2E of the buffer memory 2' and the track and sector numbers of the data stored in these memory areas are placed under control of the host computer 1 as the headers. As the memory area number data are supplied from the host computer 1 via interface circuit 11 to the microprogram control section 12a, the data of a desired sector of a desired track stored in the buffer memory 2' may be transferred to the host computer 1 any number of times. These data may be transferred directly without the necessity of re-correcting the data for errors. In this manner, when it is desired for the host computer 1 to use the data of a given sector of a given track of the floppy disk 5 a number of times, the latency time which elapses from the time the data are reproduced by the magnetic head 4 until they are introduced into the host computer 1 may be considerably reduced.

When the pointer is also in the usual sector mode at the host computer 1, the pointer may be fixed to the number of the memory area 2A.

In this manner, memory areas 2A to 2E are provided in the buffer memory 2', the recorded data are reproduced and demodulated from the floppy disk 5 on the track or sector basis and corrected for errors in the buffer memory 2', so that continuous long data may be processed on the track basis in a shorter time while short data can be processed on the sector basis in the same manner as before. In addition, the data transferred a large number of times to the host computer 1 can be stored in the buffer memory 2' until the use thereof is terminated so that the data can be processed within a shorter time.

The memory areas in the buffer memory 2 or 2' may be composed of plural sectors or tracks or of any other divisions as desired.

The numbers of the memory area 2A to 2E of the buffer memory 2' and the numbers of the tracks and sectors to which belong the data stored in the memory areas 2A to 2E are controlled at the host computer, so that the control of the buffer memory 2' is facilitated. When the disk control unit and especially the instruction execute section 12b are responsible for these controls, the load of the disk control section 10 is increased. In this case, the number of the memory areas 2A to 2E of the buffer memory 2' and the track and sector numbers to which belong the data stored in these memory areas are stored in a portion of the buffer memory 2' or other memories.

In the data processing apparatus of the present embodiment, the latency time may be shortened when it is desired that the reproducing data over plural sectors on the recording medium such as the disk be repeatedly utilized by the microcomputer. Also the data may be reproduced from the recording medium, such as the disk, on the sector or track basis, while the latency time may be reduced when the data are reproduced on the track basis.

Another operation of the floppy disk drive device will now be explained. The host computer (microcomputer) 1 writes the track number TR(k) of the data of the floppy disk 5 to be reproduced first in the parameter register assembly 24 of the interface circuit 11, while also writing in the parameter register assembly 24 the flags indicating that the track number has been written in the parameter register assembly 24. Therefore, when the host computer 1 reads the portion of the parameter register assembly 24 where the flag is written, it is seen that the track number is written in the parameter register 24 and, on detection of the flag, further writing of the track number in the parameter register assembly 24 is inhibited.

Figure 15:
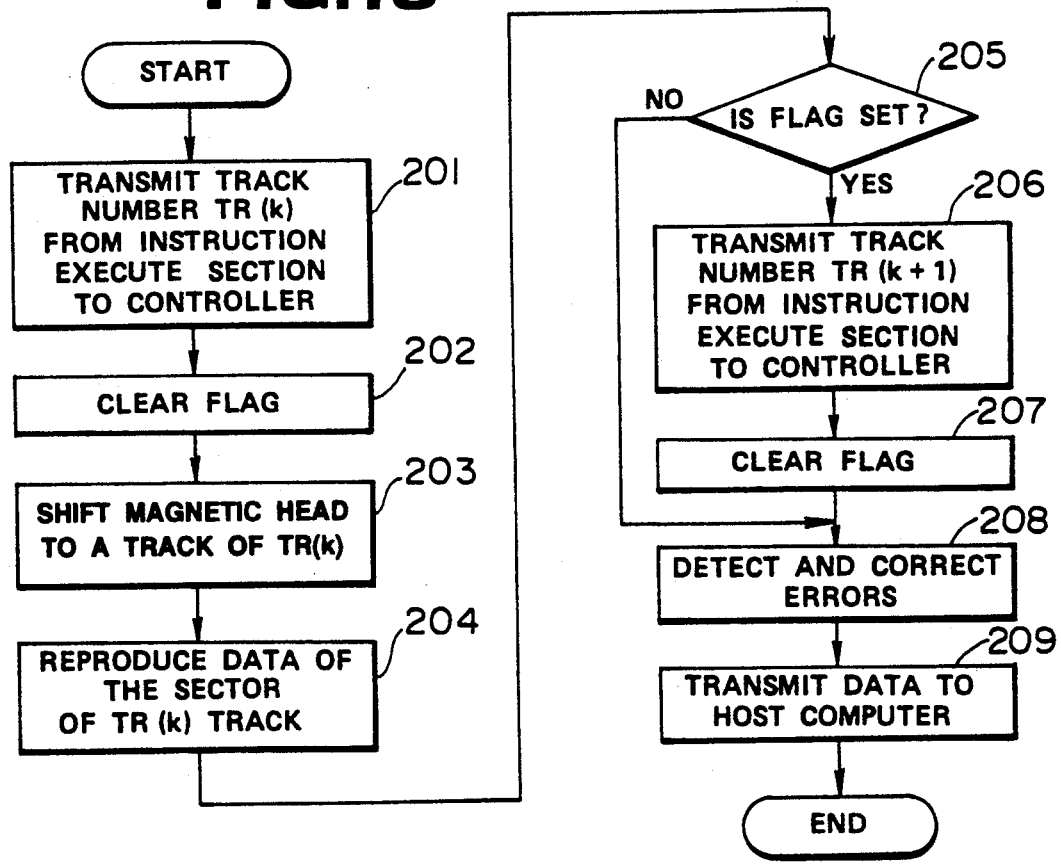
FIG. 15 is a flow chart showing a modification of the operation of the disk data recording/reproducing apparatus according to this invention.

The host computer 1 generates the commands for data reproduction from the floppy disk 5 and transfer of the reproduced data to the disk control unit 10 of the floppy disk drive device. This causes the program sequence of FIG. 15 to be started.

On reception of the start command, the instruction execute section 12b of the floppy disk drive device causes the information concerning the track number TR(k) written into the parameter register assembly 24 of the interface circuit 11 to be transferred to the mechanical system microcomputer or controller 6 at step 201, while clearing the flag written in the parameter register assembly 24 at step 202. This causes the host computer 1 to sense that the flag has been cleared and to write the number TR(k+1) of the next track to be reproduced in the parameter register assembly 24 of the interface circuit 11 as well as writing or setting in the parameter register assembly 24 the flag indicating that the track number TR(k+1) is written in the parameter register assembly 24.

On reception of the information of the track number TR(k), the mechanical system microcomputer or controller 6 controls the motor 8 to move the magnetic head 4 to the track of the number TR(k) at step 203. When the movement of the magnetic head 4 is terminated and or this fact is transmitted from the mechanical system microcomputer controller 6 to the instruction execute section 12b, the floppy disk is turned. When the predetermined sector of the disk reaches the magnetic head 4, the execute section 12b controls the recording-/reproducing/erasure circuit 3 to cause the magnetic head 4 to reproduce the data of a sector of the track TR(k) at step 204.

When the reproduction of the sector data is terminated, the instruction execute section 12b checks if the flag is set in the register assembly 24 at step 205. If the result is negative, the program proceeds to step 208 as later described. If the result of decisional step 205 is affirmative, the execute section 12b transmits the information concerning the track number TR(k+1) written in the parameter register assembly 24 of the interface circuit 11 to the mechanical system microcomputer or contorller 6 at step 206, while clearing the flag written into the parameter register assembly 24 at step 207.

On reception of the information concerning the track number TR(k+1), the mechanical system microcomputer or controller 6 controls the motor 8 in such manner that the magnetic head 4 is moved to the track of the track number TR(k+1) and, simultaneously, the data having the number reproduced from the sector of the track bearing the number TR(k) and stored in buffer memory 2' are subjected to error detection and correction on the sector basis by the error correction processor 13 at step 208. The data thus corrected for errors are read from the buffer memory 2 so as to be transferred through the interface circuit 11 to the host computer 1 at step 209. It is noted that error detection may be included within the meaning of the error correction processing in the broad sense of the term. It is possible to perform only the error correction processing in the broad sense of the term during movement of the magnetic head 4.

The above sequence of operations described with reference to steps 202-209 is repeated if the tracks of the floppy disk 5 bearing the numbers TR(k+2), TR(k+3), . . . are to be reproduced.

This results in shortening the time involved since the demand for reproducing the data over several tracks is raised by the computer 1 upon the data being transferred to the computer 1.

In the foregoing, description has been made of the case of setting or clearing the flag in the parameter register assembly of the interface circuit 11 in which are written the track numbers. However, the present invention is not limited to such embodiment. For example, it is also possible that an interruption of the host computer 1 may be caused by the instruction execute section 12b at the time the flag is cleared although the flag itself cannot be read from the host computer 1.

Error correction

A typical method for correcting the error in the data frame and sub-code will now be explained.

Error Correction for Data Frame

An algorithm of error correction of the data frame will be explained first by referring to FIG. 16. At step 301, the data contained in the $C_1$ code of each frame are sequentially read from the buffer memory 2 and transmitted to the error correction processor 13. At step 302, the error correction processor calculates the syndrome using the $C_1$ parity codes, and finds the number of the errors based on the syndrome status. It is then checked at step 303 whether the error is the 2 symbol error. If the result of step 303 is negative, it is checked at step 304 whether the error is the 1 symbol error. If the result of step 304 is negative, it is checked at step 305 whether there is no error or the error is an error of 3 or more symbols. If the error is determined to be a 1-symbol error at step 304, the error location is found at step 306 using the syndrome, and the error symbol is corrected. If the error is determined to be a 2 symbol error at step 303, the error location is found at step 307 using the syndrome and the 2 symbol error is corrected. At the next step 308, the flags $F_0$ and $F_1$ of the correction flag area of the buffer memory 2 shown in FIGS. 11 and 12A are set as indicated in FIG. 12B. In case of no error or of effecting 1-symbol or 2-symbol error correction, it is checked at step 309 whether continuity exists between the frame address of the frame and the frame address of the frame immediately before it. In case of discontinuity or in case an error of three or more symbols is found at step 305 so that correction is not possible, the flags $F_0$, $F_1$ and $F_2$ are set at the next step 310 as indicated in FIG. 12B.

The above steps are repeatedly executed for each frame. If it is found at step 311 that the processing of all of the frames is terminated, decoding of the next $C_2$ series is performed. The error correction for the sub-frames is performed in a similar manner and in advance of the above described processing of the data frames.

In the error correction for the $C_2$ series, the data of the $C_2$ series interleaved from the buffer memory 2 are read out at step 312 and the syndrome is calculated at step 313. The number of errors is then determined from the syndrome status. It is then checked at step 314 whether the error is a 2-symbol error. If the result is negative, it is checked at step 315 whether the error is a 1-symbol error. If the result is negative, it is checked at step 316 whether there is no error or whether the error is an error of three or more symbols. If the error is found to be a 1-symbol error at step 315, the error location is found at step 317 and the error symbol is corrected. More specifically, when the error location is not coincident with the location of the symbol with which the $F_2$ flag has been associated in the $C_1$ correction processing, it is checked by the number of the $F_2$ flags whether the correction is to be performed. If the correction is not effected, the current state is maintained. In the below Table 2, $N_1$ and $N_2$ denote the numbers of the symbols with which the flags $F_1$ and $F_2$ are associated and that are coincident with the error locations. $k_1$ and $k_2$ denote the numbers of the $F_1$ and $F_2$ flags and X means "don't care".

TABLE 2

| error | flag condition | | | | operate |
|---|---|---|---|---|---|
| 0 | — | | | | no correct |
| 1 | N2 = 1 | | | | 1 error correct |
| | N2 = 0 | K2 ≦ 3 | | | 1 error correct |
| | N2 = 0 | K2 ≧ 4 | | | uncorrect |
| 2 | N1 = 2 | N2 = 2 | K2 = 2 | | 2 error correct |
| | N1 = 2 | N2 = 1 | K2 ≦ 2 | | 2 error correct |
| | N1 = 2 | N2 = 0 | K2 = 0 | | 2 error correct |
| | N1 = 2 | N2 = 0 | K1 ≦ 4 | K2 = 1,2 | 2 error correct |
| | N1 = 2 | N2 = 0 | K1 ≦ 5 | K2 = 1,2 | uncorrect |
| | N1 = 1 | | K1 ≦ 3 | K2 ≦ 2 | 2 error correct |
| | N1 = 1 | | K1 ≧ 4 | K2 ≦ 2 | uncorrect |
| | N1 = 0 | | K2 ≦ 2 | | uncorrect |
| | K1 = 3 | K2 = 3 | | | 3 erasure correct |
| | K1 ≧ 5 | K2 = 3 | (N2 = 1) | | 2 erasure & 1 error correct |
| | K1 ≧ 5 | K2 = 3 | (N2 = 0) | | uncorrect |
| | K1 = 4 | K2 = 3,4 | | | 4 erasure correct |
| | K1 ≧ 5 | K2 ≧ 4 | | | uncorrect |
| more than 3 | K1 = 3 | | | | 3 erasure correct |
| | K1 ≧ 5 | K2 = 3 | (N2 = 1) | | 2 erasure & 1 error correct |
| | K1 ≧ 5 | K2 = 3 | (N2 = 0) | | uncorrect |
| | K1 = 4 | | | | 4 erasure correct |
| | K1 ≧ 5 | K2 ≠ 3 | | | uncorrect |
| | K1 ≦ 2 | | | | uncorrect |

N1: number of flags corresponding with the error location
N2: number of flags corresponding with the error location
K1: number of F1 flags
K2: number of F2 flags N1: number of flags corresponding with the error location
N2: number of flags corresponding with the error location
K1: number of F1 flag
K2: number of F2 flag
x: don't care When the error is determined to be (a) 2-symbol error at step 314, the number of the $F_2$ flags is determined at step 318. When the error is an error of 2 or less symbols, the 2-symbol error correction processing is performed at step 319. When the error is an error of more than two symbols, an erasure correction processing as later described is performed. It is determined at step 319 whether the 2-symbol error correction should be performed under the condition shown in Table 2, or the data should be left unchanged, that is, without error correction.

When it is determined that there exist errors of three or more symbols at step 316 or that the number of $F_2$ flags exceeds two at step 318, it is determined at steps 320 and 321 whether the number of $F_1$ flags is 3 or 4. When it is three, a 3-erasure correction is performed at step 322 and, when it is four, a 4-erasure correction is performed at step 323.

When it is determined at steps 320 and 321 that the number of $F_1$ flags is neither 3 nor 4, the numbers of $F_1$ and $F_2$ flags are determined at step 324. A 2-erasure correction and a 1-error correction are performed at step 322 only when the number of $F_1$ g flags is not less than 5 and the number of $F_2$ flags is 3.

When the correction is not made in the above procedure, the data are treated as error.

The above steps are repeated for each series and, when it is determined at step 325 that the processing of the series $C_1$ and $C_2$ is ended, the correction is terminated.

At the time of the correction by the $C_2$ parity codes, when it is determined above all that there exist errors of two or more symbols, an erasure correction routine is performed when the number of $F_2$ flags set for symbols contained in the $C_2$ series exceeds 2, that is, 3 or more, and a 2-error correction routine or double error correction is performed when the number of $F_2$ flags does not exceed two. It is when the errors of 3 or more symbols or burst errors are caused that the $F_2$ flags are set in the course of correction by the $C_1$ parity codes. However, in a majority of cases, burst errors are caused if the symbol error rate is not higher than $10^{-3}$. In this manner, wasteful 2-error correction routines are not executed on occurrence of burst errors and the uncorrectable errors otherwise caused during the correction routines may be avoided with a significantly improved correction capability for burst errors. The result would be most favorable when the burst error length is 8 to 14 frames.

It will be appreciated from the foregoing description that, in accordance with the present embodiment of the invention, when it is determined that there are errors of a number of symbols larger than the number that may be corrected for errors, such as two symbols, an erasure correction is executed unless the number of flags indicates that the correction is not possible by the $C_1$ parity codes and the flags set for symbols contained in the $C_2$ series exceeds a predetermined number, such that the correction capability for burst errors may be improved significantly.

It is noted that up to double errors can be corrected by the $C_1$ parity codes, while up to quadruple errors can be corrected by the $C_2$ parity codes. More specifically, error correction of m symbols and/or erasure correction of n symbols are possible with the $C_2$ parity codes, wherein m and n are given by the formula $$2m+n \leq d-1$$

where d is an integer equal to the minimum distance between the codes for example, $d=5$. In case of 4-symbol errors, the following formulas hold for the syndromes $S_0$, $S_1$, $S_2$ and $S_3$.

$$\begin{cases} S_0 = e_i + e_j + e_k + e_L & (1) \\ S_1 = \alpha^i e_i + \alpha^j e_j + \alpha^k e_k + \alpha^L e_L & (2) \\ S_2 = \alpha^{2i} e_i + \alpha^{2j} e_j + \alpha^{2k} e_k + \alpha^{2L} e_L & (3) \\ S_3 = \alpha^{3i} e_i + \alpha^{3j} e_j + \alpha^{3k} e_k + \alpha^{3L} e_L & (4) \end{cases}$$

where $e_i$, $e_j$, $e_k$, and $e_l$ represent error patterns, represents the root satisfying the irreducible polynominal $F_{(x)}=0$ on the galois field $CF(2^M)$, where, for example, $M=8$, and i, j, k, l represent error locations. In case of a 3-symbol error, $e_l=0$. The error locations i, j and k only are known in the triple erasure correction, while the error locations i and j only are known in the double error correction plus single error correction.

Solving the simultaneous equations (1) to (4) with respect to the error patterns $e_i$, $e_j$, $e_k$ and $e_l$, the following equations for the quadruple erasure correction are obtained.

$$e_i = \frac{S_0 + (\alpha^{-j} + \alpha^{-k} + \alpha^{-L})S_1 + (\alpha^{-j-k} + \alpha^{-k-L} + \alpha^{-L-j})S_2 + \alpha^{-j-k-L}S_3}{(1+\alpha^{i-j})(1+\alpha^{i-k})(1+\alpha^{i-L})} \quad (5)$$

$$e_j = \frac{S_0 + (\alpha^{-k} + \alpha^{-L} + \alpha^{-i})S_1 + (\alpha^{-k-L} + \alpha^{-L-i} + \alpha^{-i-k})S_2 + \alpha^{-k-L-i}S_3}{(1+\alpha^{j-i})(1+\alpha^{j-k})(1+\alpha^{j-L})} \quad (6)$$

$$e_k = \frac{S_0 + (\alpha^{-L} + \alpha^{-i} + \alpha^{-j})S_1 + (\alpha^{-L-i} + \alpha^{-i-j} + \alpha^{-j-L})S_2 + \alpha^{-L-i-j}S_3}{(1+\alpha^{k-i})(1+\alpha^{k-j})(1+\alpha^{k-L})} \quad (7)$$

$$e_L = \frac{S_0 + (\alpha^{-i} + \alpha^{-j} + \alpha^{-k})S_1 + (\alpha^{-i-j} + \alpha^{-j-k} + \alpha^{-k-i})S_2 + \alpha^{-i-j-k}S_3}{(1+\alpha^{L-i})(1+\alpha^{L-j})(1+\alpha^{L-k})} \quad (8)$$

In case of the triple erasure correction or the double erasure corrections plus single error corrections, the simultaneous equations (1) to (4) ($e_1=0$) are solved with respect to the error patterns $e_i$, $e_j$ and $e_k$ to give the following equations (9) to (12) wherein, in the double error correction plus single error correction, $\alpha^k$, that is, the error location, is also found.

$$\begin{cases} \alpha^k = \frac{S_1 \alpha^{i+j} + S_2(\alpha^i + \alpha^j) + S_3}{S_0 \alpha^{i+j} + S_1(\alpha^i + \alpha^j) + S_2} & (9) \\ \\ e_i = \frac{S_0 \alpha^{j+k} + S_1(\alpha^j + \alpha^k) + S_2}{(\alpha^i + \alpha^j)(\alpha^i + \alpha^k)} & (10) \\ \\ e_j = \frac{S_0 \alpha^{i+k} + S_1(\alpha^i + \alpha^k) + S_2}{(\alpha^j + \alpha^i)(\alpha^j + \alpha^k)} & (11) \\ \\ e_k = \frac{S_0 \alpha^{i+j} + S_1(\alpha^i + \alpha^j) + S_2}{(\alpha^k + \alpha^i)(\alpha^k + \alpha^j)} & (12) \end{cases}$$

In this manner, in the case of quadruple erasure correction, and in the case of triple error correction and double error correction plus single error correction, the arithmetic operations by separate equations are usually carried out, with an increased program volume and time involved in the arithmetic Thus the quadruple erasure correction and triple erasure correction (or double erasure correction plus single error correction) are carried out using the common terms for the two sets of equations, that is, the set of equations (5) to (8) for finding the quadruple error patterns and the set of equations (9) to (12) for finding the triple error patterns, instead of carrying out separate arithmetic operations using these sets of equations. In the present embodiment, these common terms are expressed by the following equations.

$$\begin{cases} A = \alpha^{i+j} & (13) \\ B = \alpha^i + \alpha^j & (14) \\ C = S_1 A + S_2 B + S_3 & (15) \\ D = S_0 A + S_1 B + S_2 & (16) \end{cases}$$

Using these equations (13) to (16) for the above common 8 terms, the equations (5) to (8) for finding the quadruple error patterns may be expressed by the following formulas (17) to (19):

$$\begin{cases} e_L = \dfrac{D\alpha^k + C}{(A + B\alpha^L + \alpha^{2L})(\alpha^L + \alpha^k)} & (17) \\ e_k = \dfrac{D\alpha^L + C}{(A + B\alpha^k + \alpha^{2k})(\alpha^L + \alpha^k)} & (18) \\ e_j = \dfrac{S_0 \alpha^i + S_1 + (\alpha^i + \alpha^k)e_k + (\alpha^i + \alpha^L)e}{B} & (19) \\ e_i = S_o + e_i + e_k + e_j & (20) \end{cases}$$

Using the same equations (13) to (16), the equations (9) to (12) for finding the triple error patterns may be expressed by the following formulas (21) to (24):

$$\begin{cases} \alpha^k = \dfrac{C}{D} & (21) \\ e_k = \dfrac{D}{(\alpha^i + \alpha^k)(\alpha^j + \alpha^k)} & (22) \\ e_j = \dfrac{S_0 \alpha^i + S_1 + \alpha^i(\alpha^k)e_k}{B} & (23) \\ e_i = S_0 + e_k + e_j & (24) \end{cases}$$

The above common terms are found in advance and substituted into equations (17) to (20) to find the error patterns $e_i$, $e_j$, $e_k$ and $e_l$ in the case of the quadruple error correction and into the equations (21) to (24) to find the error patterns $e_i$, $e_j$, and $e_k$ in the case of the triple erasure correction and double error correction plus single error correction. It is noted that $\alpha^k$ is to be found only in the case of the double erasure correction plus single error correction.

In this manner, when carrying out the arithmetic operations for error correction and/or erasure correction of different numbers of symbols, those portions common to these operations are computed in advance for reducing the program volume for the arithmetic operations and shortening the computing time.

The methods of deriving the equations (17) to (20) for finding the quadruple error patterns and the equations (21) to (24) for finding the triple error patterns will be hereafter explained. First, the equations for finding the quadruple error patterns are derived in the following manner. By multiplying denominators and the numerators of the equations (8) and (7) by $\alpha^{i+j+k}$ and $\alpha^{i+j+l}$, respectively, the following equations are obtained:

$$e_L = \dfrac{\alpha^{i+j+k}S_0 + (\alpha^{i+j} + \alpha^{j+k} + \alpha^{k+1})S_1 + (\alpha^i + \alpha^j + \alpha^k)S_2 + S_3}{(\alpha^L + \alpha^i)(\alpha^L + \alpha^j)(\alpha^L + \alpha^k)} \quad (25)$$

$$= \dfrac{\{\alpha^{i+j}S_0 + (\alpha^i + \alpha^j)S_1 + S_2\}\alpha^k + \{\alpha^{i+j}S_1 + (\alpha^i + \alpha^j)S_2 + S_3\}}{\{\alpha^{i+j} + (\alpha^{i+j})\alpha^L + \alpha^{2L}\}(\alpha^L + \alpha^k)}$$

$$e_k = \dfrac{\alpha^{i+j+L}S_0 + (\alpha^{i+j} + \alpha^{j+L} + \alpha^{L+i})S_1 + (\alpha^i + \alpha^j + \alpha^L)S_2 + S_3}{(\alpha^k + \alpha^i)(\alpha^k + \alpha^j)(\alpha^k + \alpha^L)} \quad (26)$$

$$= \dfrac{\{\alpha^{i+j}S_0(\alpha^i + \alpha^j)S_1 + S_2\}\alpha^L + \{\alpha^{i+j}S_1 + (\alpha^i + \alpha^j)S_2 + S_3\}}{\{\alpha^{i+j} + (\alpha^{i+j})\alpha^k + \alpha^{2k}\}(\alpha^k + \alpha^L)}$$

By introducing the above equations (13) to (16) for the above common terms, the equations (17) and (18) are obtained from the above equations (25) and (26). Also, by finding the equation x o' plus equation (2), the following equations are obtained.

$$\alpha^i S_0 + S_1 = (\alpha^i + \alpha^j)e_j + (\alpha^i + \alpha^k)e_k + (\alpha^i + \alpha^L)e_l \quad (27)$$

$$\therefore e_j = \dfrac{\alpha^i S_0 + S_1 + (\alpha^i + \alpha^k)e_k(\alpha^i + \alpha^L)e_L}{\alpha^i + \alpha^j} \quad (28)$$

By introducing equation (14) into equation (28), equation (19) may be obtained. Also the equation (20) may be obtained from the equation (1).

The equations for finding the triple error patterns are derived in the following manner. The equations (21) and (22) may be obtained by introducing the above equations (13) to (16) for the common terms into the equations (9) and (12). Also, by setting $e_l=0$ in equation (28), we obtain $$e_j = \dfrac{\alpha^i S_0 + S_1 + (\alpha^i + \alpha^k)e_k}{\alpha^i + \alpha^j} \quad (29)$$

so that, by introducing equation (14) into equation (29), equation (23) may be obtained. Equation (24) may be obtained by setting $e_1=0$ in equation (1).

It will be appreciated from the above that, according to the error correction and decoding method of the present invention, those portions common to the arithmetic operations for the error corrections and/or erasure correction with different numbers of symbols are computed in advance, such that the program volume and the computing time necessary for those arithmetic operations may be reduced.

Error Correction for Sub-Codes

The error correction for the sub-codes is performed separately from the error correction for the coding data, and before or after the correction for the coding data or after the $C_1$ correction of the coding data. In the error correction routine for the sub-codes illustrated in FIG. 17, decoding is performed at step 401 from the last sub-code $S_{C3}$ in the reproducing sequence. It is then checked at step 402 whether the decoding is possible. If the decoding is possible, the decoding data of the subcode $S_{C3}$ is transmitted to the host computer 1 at step 403 to terminate the decoding. If the decoding for the subcode $S_{C3}$ is not possible, decoding for the sub-code $S_{C2}$ is carried at step 404. The error correction for the sub-codes by the parity codes is carried out in the same manner as in the $C_1$ correction described above. Thus, up to double errors can be corrected and decoding is possible if the number of errors is two or less symbols.

When the step 404 is executed, it is then checked at step 405 whether decoding of the sub-code $S_{C2}$ at step 404 is possible. If the decoding is possible, the decoding data for the sub-code $S_{C2}$ are transmitted to the host computer 1 at step 406 to terminate the decoding when the decoding for the sub-code $S_{C2}$ is not possible, decoding of the sub-code $S_{C1}$ is carried out at step 407.

When the step 407 is executed, it is then checked at step 408 whether decoding for the sub-code $S_{C1}$ at step 407 is possible. When the decoding is possible, the decoding data for the sub-code $S_{C1}$ are transmitted to the host computer 1 at step 409 to terminate the decoding. When the decoding for the subcode $S_{C1}$ is not possible, decoding for the sub-code $S_{C0}$ is carried out at step 410.

When the step 410 is executed, it is then checked at step 411 whether the decoding for the sub-code $S_{C0}$ at step 410 is possible. If the decoding is possible, the decoding data for the sub-code $S_{C0}$ are transmitted to the host computer 1 at step 412 to terminate the decoding. If the decoding for the sub-code $S_{C0}$ is not possible, the information that none of the sub-codes $S_{C0}$ to $S_{C3}$ could be decoded is transmitted to the host computer 1 at step 413 to terminate the decoding.

In the present embodiment, decoding is performed by the reverse of the reproducing procedure and thus starts at the sub-code $S_{C3}$. This sub-code $S_{C3}$ is less prone to burst errors than the first sub-code $S_{C0}$ that is to be decoded on starting the reproducing operation, so that the possibility is low that the decoding for the sub-code $S_{C3}$ becomes impossible to perform at the outset of the decoding operation and, therefore, the decoding data for the sub-codes may be obtained in a shorter time. In addition, the sub-code $S_{C3}$, being less prone to burst errors, is less subject to mistaken correction so that the operating reliability is also improved.

Alternatively, the decoding may be started at the sub-code $S_{C1}$ or the sub-code $S_{C2}$.

According to the present embodiment, on reception of a data block containing a plurality of the same repeatedly transmitted encoded data, a decoding operation including the error correction is carried out starting at the data other than the data received first, and hence less prone to burst errors. Therefore, the possibility is low that the decoding becomes impossible to perform at the outset of the decoding operation, with the results the decoding data may be obtained in a shorter time. In addition there is less likelihood that the mistaken correction may take place at the time of decoding so that the operational reliability is similarly improved.

Copy Protect Code

The method of utilizing the copy protect codes will now be explained. The host computer 1 reads the copy protect code CP1 previously read from the disk 5 and written into the buffer memory 2, and compares the code with the copy protect code CP1 which the host computer 1 itself stores in the internal ROM. If the read data are of an original disk, the two copy protect codes CP1 coincide and the regular operational sequence may be executed computer 1.

However, when copying the software of the host computer 1 on another disk, the controller 12 operates in such a manner that the dummy copy protect code in the host computer 1, such as the CP2, is written in place of the authentic copy protect code CP1. In the software of the thus copied disk, only the copy protect code is exchanged to CP2. When reading and operating the thus copied disk, the copy protect code of the buffer memory 2 is CP2 which is different from the copy protect code CP1 of the host computer 1. From the foregoing, the host computer 1 senses that the copied disk has been illicitly copied and accordingly may inhibit its usual operation.

In the above arrangement, the copied disk cannot be reproduced or operated in the usual manner. However, if the copy protect code CP1 written in the buffer memory 2 when reading the original disk is noted, and the copy protect code CP2 on the buffer memory 2 is changed by an operation from the outside to CP1 when reading the data from the copied disk next time, it would then become possible to execute the software of the buffer memory 2 when accessing the copy protect code from the host computer 1, despite the fact that the disk is a copied disk, since CP1 exists at this time in the memory 2. It is possible to rewrite or change the data on the buffer memory 2 by inserting a jig for rewriting the memory contents into a bus disposed between the buffer memory 2 and the disk control unit 10 which is mounted outside the buffer memory 2.

Thus a register is provided in the disk control section 10 designed as one-chip IC. This register may be of a smaller capacity only sufficient to store the copy protect data transiently. The controller 12 is aware of the data strings of addresses such that, when control is at the copy protect code, the controller inhibits data output to the buffer memory 2 and causes data writing in the register in disk control section 10. The data transfer form the buffer 2 into the host computer 1 may take place in the usual manner. However, when the host computer 1 intends to have the copy protect code, the controller 12 returns the copy protect code from the register of the disk control section 10 to the buffer memory 2.

Thus the operation of the disk is the same as before, if the disk is the original one.

Upon reading the copied disk, data are written into the buffer memory 2, while the copy protect code CP2 is written in the register of the disk control unit 10. This copy protect code CP2 is stored in the one-chip disk control section 10 and hence cannot be rewritten or changed from outside. Although the copy protect data may be stolen by way of the bus disposed between the host computer 1 and the disk control section 10, the copied disk cannot be executed or reproduced, since it is impossible to rewrite or change the copy protect code written in the register of the section 10.

What is claimed is:

1. A data processing apparatus of the type having an external data storage medium, said apparatus comprising:
    a host computer for generating macrocommand instructions for initiating data transfer between said host computer and said storage medium, each macrocommand instruction representing a series of predetermined instructions to be executed as a microprogram routine;
    microprogram control means responsive to a macrocommand instruction from said host computer for generating a respective set of microprogram instruction steps determined by said macrocommand instruction;

memory means for storing data from said host computer for subsequent recording on said storage medium and for storing data reproduced from said storage medium for subsequent supply to said host computer;

recording and reproducing means for recording the data supplied from said memory means on said storage medium and for reproducing the data stored on said storage medium for supply to said memory means; and memory control means responsive to a respective set of microprogram instruction steps for controlling the supply of said data to and from said memory means and including control data storage means for storing control data indicating a start address in said memory means and a desired number of data to be transferred, the data transferred to and from said memory means being stored in and retrieved from, respectively, addresses in said memory means starting from said start address and having a number corresponding to said number of data to be transferred.

* * * * *